(12) United States Patent
Takahira et al.

(10) Patent No.: US 9,068,714 B2
(45) Date of Patent: Jun. 30, 2015

(54) LIGHT-EMITTING DEVICE AND VEHICLE HEADLIGHT

(71) Applicant: Sharp Kabushiki Kaisha, Osaka-shi (JP)

(72) Inventors: Yoshiyuki Takahira, Osaka (JP); Koji Takahashi, Osaka (JP); Yosuke Maemura, Osaka (JP); Hiroshi Kijima, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 129 days.

(21) Appl. No.: 13/855,483

(22) Filed: Apr. 2, 2013

(65) Prior Publication Data

US 2013/0265561 A1    Oct. 10, 2013

(30) Foreign Application Priority Data

Apr. 6, 2012    (JP) ................ 2012-087543

(51) Int. Cl.
*F21V 7/00*  (2006.01)
*F21V 8/00*  (2006.01)
(Continued)

(52) U.S. Cl.
CPC ............... *F21V 7/00* (2013.01); *G02B 6/0005* (2013.01); *F21S 48/17* (2013.01); *F21V 7/06* (2013.01); *F21V 9/00* (2013.01); *F21V 13/14* (2013.01); *F21Y 2101/02* (2013.01); *F21Y 2101/025* (2013.01); *F21Y 2105/001* (2013.01); *H01S 5/0071* (2013.01); *H01S 5/02212* (2013.01); *H01S 5/02248* (2013.01); *H01S 5/02288* (2013.01); *H01S 5/02469* (2013.01); *H01S 5/4056* (2013.01); *B60Q 1/143* (2013.01); *F21S 48/1145* (2013.01); *F21S 48/1241* (2013.01); *F21S 48/1747* (2013.01); *G02B 6/0008* (2013.01); *B60Q 1/085* (2013.01); *B60Q 2300/324* (2013.01); *B60Q 2300/331* (2013.01); *B60Q 2300/45* (2013.01); *B60Q 2300/42* (2013.01); *F21V 29/70* (2015.01)

(58) Field of Classification Search
USPC ............ 356/3, 3.01, 213–233; 362/509, 260, 362/244, 231, 613, 235, 236, 553, 538
See application file for complete search history.

(56) References Cited

U.S. PATENT DOCUMENTS 7,510,300 B2 * 3/2009 Iwauchi et al. ............... 362/231
7,576,845 B2 * 8/2009 Asakura et al. ................ 356/73
(Continued)

FOREIGN PATENT DOCUMENTS

JP    2003-45210     2/2003
JP    2005-283290    10/2005
(Continued)

OTHER PUBLICATIONS

Takahira et al., Office Action mailed May 6, 2015, directed to U.S. Appl. No. 13/853,785; 14 pages.

*Primary Examiner* — Sang Nguyen
(74) *Attorney, Agent, or Firm* — Morrison & Foerster LLP

(57) ABSTRACT

A light-emitting device includes a plurality of laser elements, a light-emitting section for emitting light in response to a laser beam, and an emission control section for controlling whether each of the plurality of laser elements emits light or not. At least a part of the plurality of laser elements is positioned in such a manner that irradiation regions of the light-emitting section are positioned at least partially differently.

15 Claims, 18 Drawing Sheets

(51) Int. Cl.
  *F21V 29/00*  (2006.01)
  *F21S 8/10*  (2006.01)
  *F21V 7/06*  (2006.01)
  *H01S 5/40*  (2006.01)
  *B60Q 1/14*  (2006.01)
  *B60Q 1/08*  (2006.01)
  *F21V 9/00*  (2015.01)
  *F21V 13/14*  (2006.01)
  *F21Y 101/02*  (2006.01)
  *F21Y 105/00*  (2006.01)
  *H01S 5/00*  (2006.01)
  *H01S 5/022*  (2006.01)
  *H01S 5/024*  (2006.01)
  *F21V 29/70*  (2015.01)

(56) References Cited

U.S. PATENT DOCUMENTS 8,743,158 B2 * 6/2014 Kang ........................... 345/690
2002/0196639 A1   12/2002 Weidel
2004/0041997 A1 * 3/2004 Uomori et al. ............... 356/3.01
2007/0002283 A1 * 1/2007 Shimada ......................... 353/31
2011/0032717 A1   2/2011 Kamitani et al.
2011/0122638 A1   5/2011 Konishi
2011/0235356 A1   9/2011 Sato et al.
2011/0249460 A1   10/2011 Kushimoto
2011/0280039 A1 * 11/2011 Kishimoto ..................... 362/554
2012/0106183 A1 * 5/2012 Takahashi ..................... 362/509
2012/0299476 A1 * 11/2012 Roberts et al. ................. 315/77

FOREIGN PATENT DOCUMENTS

| JP | 2009-184463 | 8/2009 |
| JP | 2009-204459 | 9/2009 |
| JP | 2011-37337 | 2/2011 |
| JP | 2011-113668 | 6/2011 |
| JP | 2011-134619 | 7/2011 |
| JP | 2011-157022 | 8/2011 |
| JP | 2011-198720 | 10/2011 |
| JP | 2011-222238 | 11/2011 |

* cited by examiner

US 9,068,714 B2

LIGHT-EMITTING DEVICE AND VEHICLE HEADLIGHT

This Nonprovisional application claims priority under 35 U.S.C. §119 on Patent Application No. 2012-087543 filed in Japan on Apr. 6, 2012, the entire contents of which are hereby incorporated by reference.

TECHNICAL FIELD

The present invention relates to a light-emitting device and a vehicle headlight each having a high color rendering property and being capable of realizing any light distribution pattern.

BACKGROUND ART

In recent years, researches have been actively made into a light-emitting device which uses, as illumination light, fluorescence that a light-emitting section containing a fluorescent body generates in response to excitation light emitted from an excitation light source which is a semiconductor light emitting element such as a light emitting diode (LED) or a semiconductor laser (LD: Laser Diode).

A technique related to such a light-emitting device is exemplified by light-emitting devices disclosed in Patent Literatures 1 through 4.

Patent Literature 1 allows a vehicle headlamp having variable illumination characteristics to be mechanically simply structured and improves obstacle resistance and response speed. Patent Literature 2 discloses a headlight which, while restraining an enlargement, is capable of (i) reducing electric power consumption and (ii) forming desired density in a light distribution pattern. Patent Literature 3 discloses a vehicle lamp capable of electrically switching between a horizontally wide light distribution pattern and a light distribution pattern suitable for AFS (Adaptive Front-lighting System) casting light beams leftward and rightward. Patent Literature 4 discloses a light source device which prevents a device from getting large-sized, increasing in weight, and getting high in manufacturing cost even in the light source device equipped with a function of varying light distribution.

CITATION LIST

Patent Literatures

Patent Literature 1
Japanese Patent Application Publication, Tokukai, No. 2003-45210 (Publication Date: Feb. 14, 2003)
Patent Literature 2
Japanese Patent Application Publication, Tokukai,
No. 2011-157022 A (Publication Date: Aug. 18, 2011)
Patent Literature 3
Japanese Patent Application Publication, Tokukai, No. 2011-113668 A (Publication Date: Jun. 9, 2011)
Patent Literature 4
Japanese Patent Application Publication, Tokukai, No. 2011-134619 A (Publication Date: Jul. 7, 2011)

SUMMARY OF INVENTION

Technical Problem

However, the techniques described in the above patent literatures have a problem below.

That is, the vehicle headlamp of Patent Literature 1 etc. does not have a color rendering property which is sufficient to be used for a vehicle headlamp. Furthermore, the vehicle headlamp of Patent Literature 1 etc. has difficulty in varying a light distribution pattern.

The present invention was made in view of the foregoing problem. An object of the present invention is to provide a light-emitting device, a floodlight, and a vehicle headlight each has a color rendering property sufficient to be used for a vehicle headlamp and is capable of varying a light distribution pattern.

Solution to Problem

In order to solve the foregoing problem, a light-emitting device in accordance with one aspect of the present invention is a light-emitting device, including: a plurality of laser beam sources each for emitting a laser beam; a light-emitting section for emitting light in response to the laser beam emitted from at least one of the plurality of laser beam sources; and emission control means for controlling whether each of the plurality of laser beam sources emits light or not, at least a part of the plurality of laser beam sources being positioned in such a manner that irradiation regions of the light-emitting section which are respectively irradiated with the laser beams emitted from the plurality of laser beam sources are positioned at least partially differently.

Advantageous Effects of Invention

The light-emitting device of the present invention has a color rendering property sufficient to be used for a vehicle headlamp, and is capable of varying a light distribution pattern.

Figure 12:
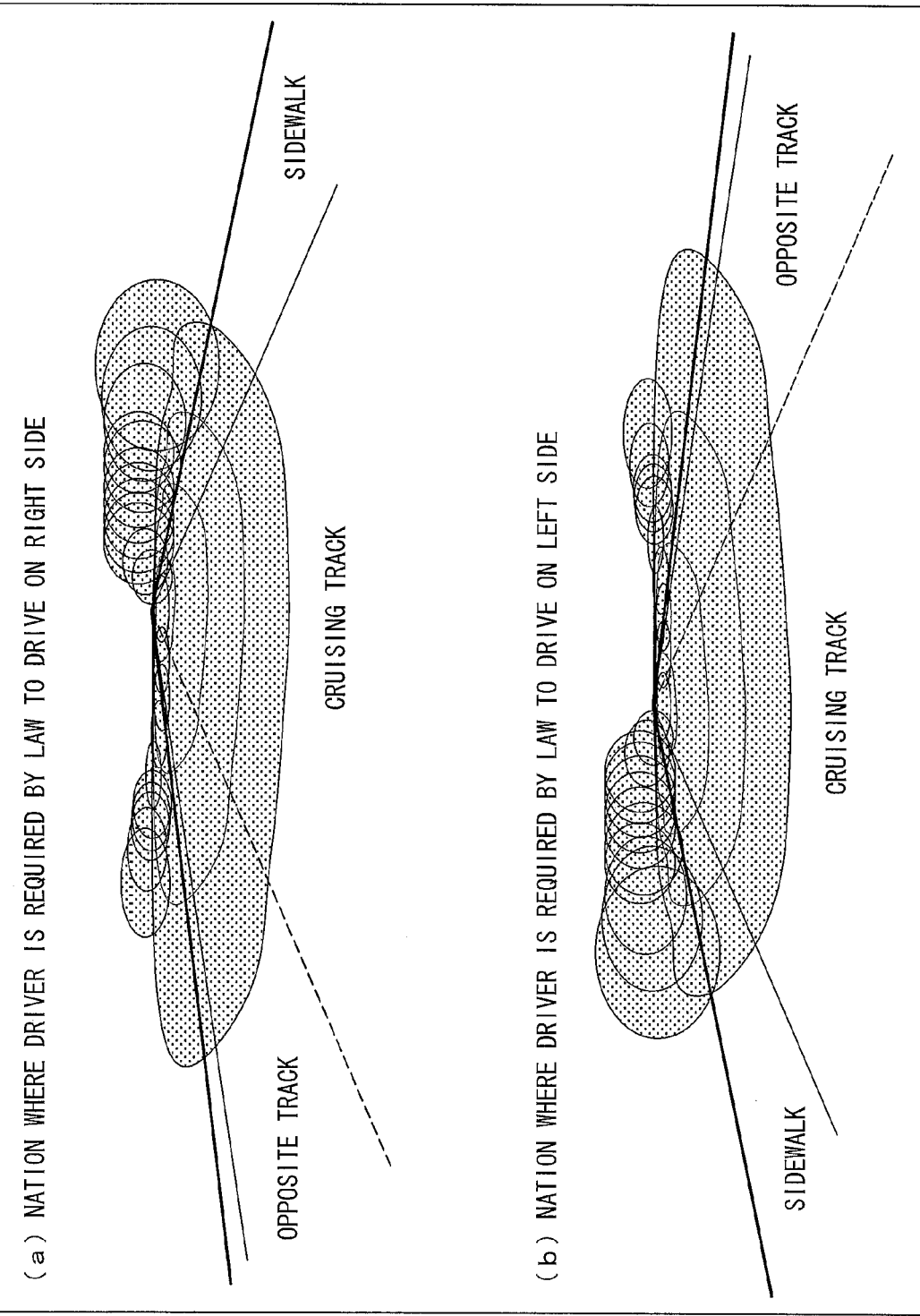
FIG. 12

(a) of FIG. 12 is a view illustrating a light distribution pattern of the headlamp in accordance with the present embodiment in a case where a vehicle is driven in a nation where a driver is required by law to drive on the right side. (b) of FIG. 12 is a view illustrating a light distribution pattern of the headlamp in accordance with the present embodiment in a case where a vehicle is driven in a nation where a driver is required by law to drive on the left side.

FIG. 13

Figure 13:
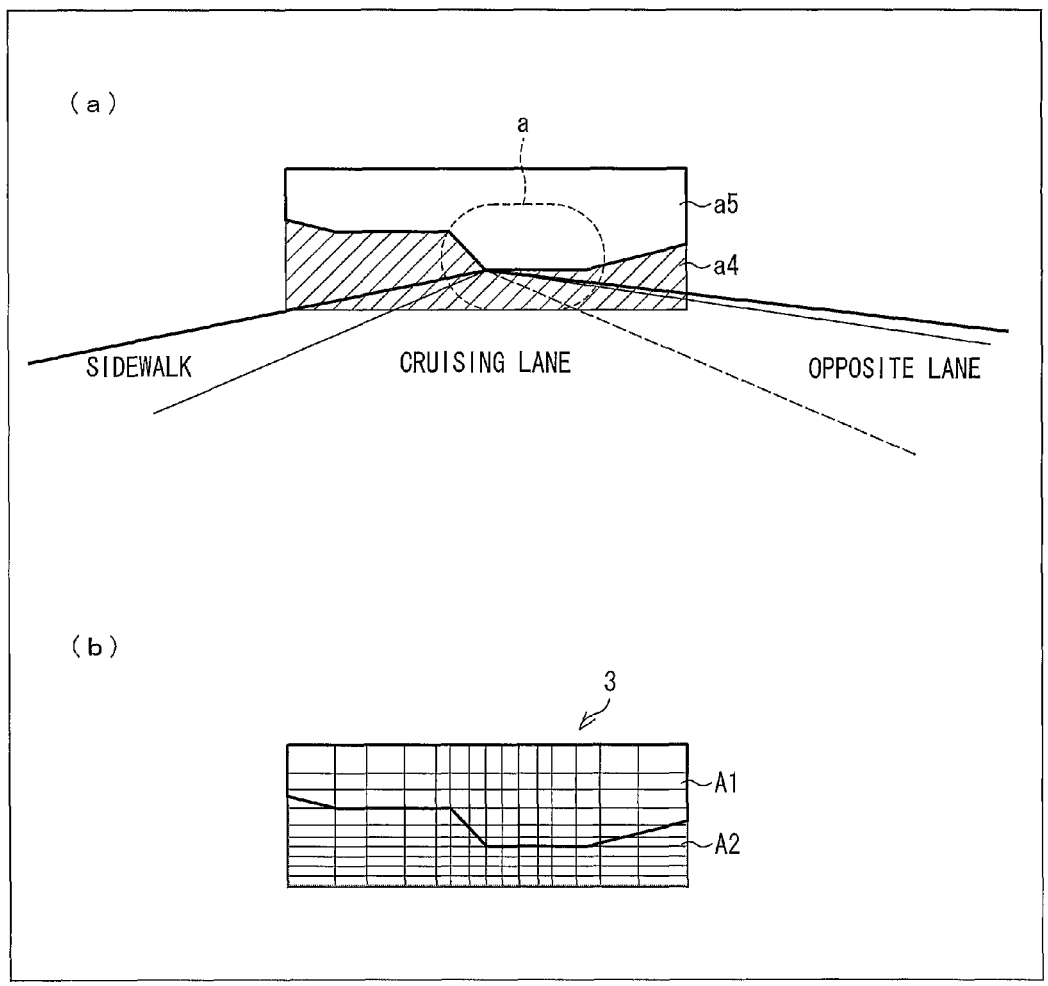

(a) of FIG. 13 is a view illustrating an example of a range of floodlighting formed by light emitted from the headlamp. (b) of FIG. 13 is a view illustrating an example of an irradiation region formed on a light-emitting section in a case where the range of floodlighting illustrated in (a) of FIG. 13 is formed.

Figure 14:
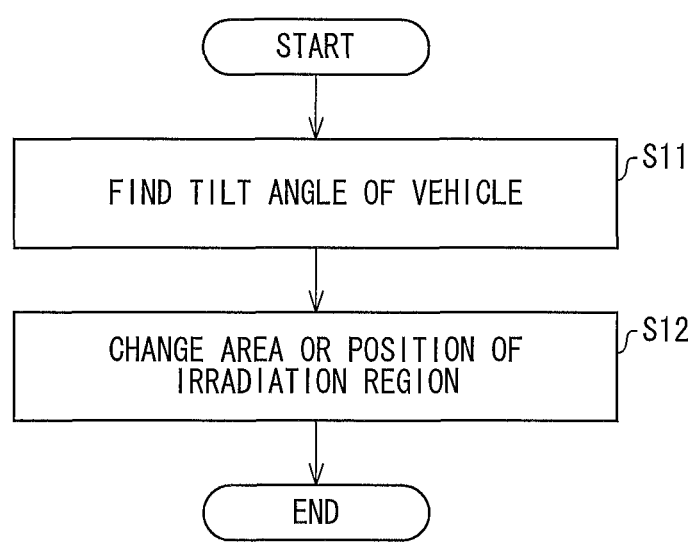

FIG. 14 is a view showing a flow of a process carried out by the headlamp.

FIG. 15

Figure 15:
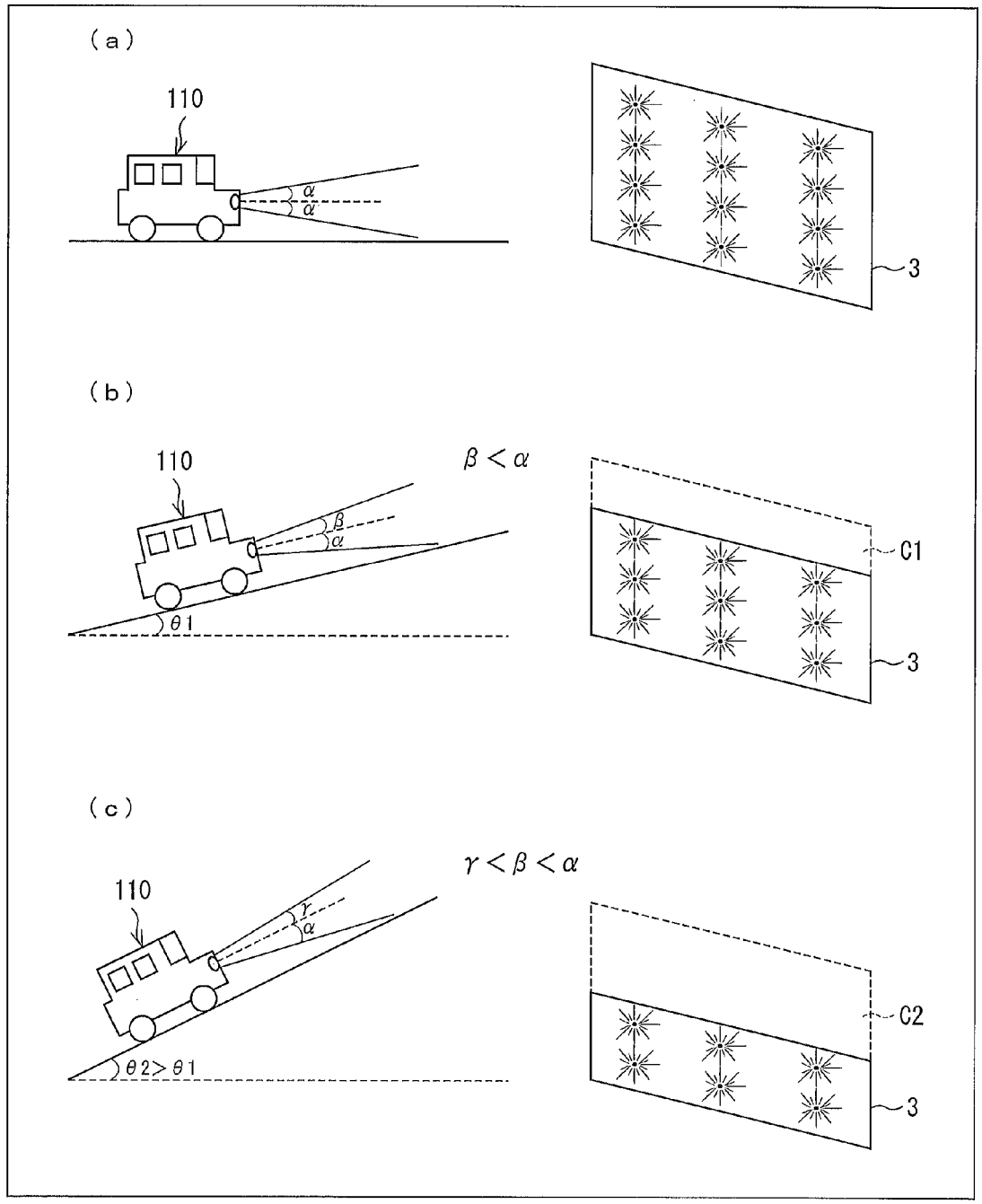

Each of (a) through (c) of FIG. 15 illustrates an example of a relationship between a tilt angle of a vehicle and change of an irradiation region.

Figure 16:
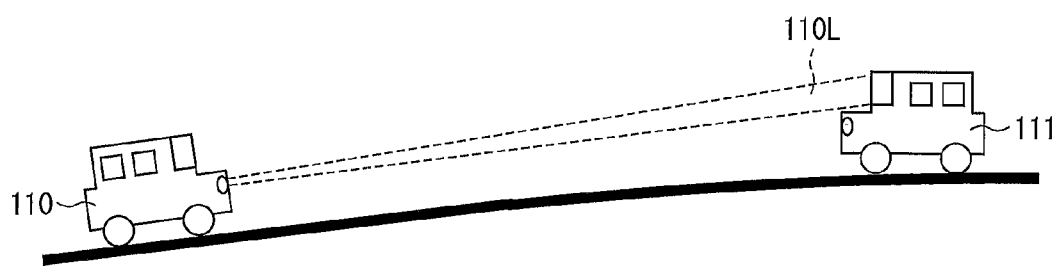

FIG. 16 is a view schematically illustrating how illumination light emitted from a vehicle has an influence on an oncoming vehicle at a start of an uphill slope.

Figure 17:
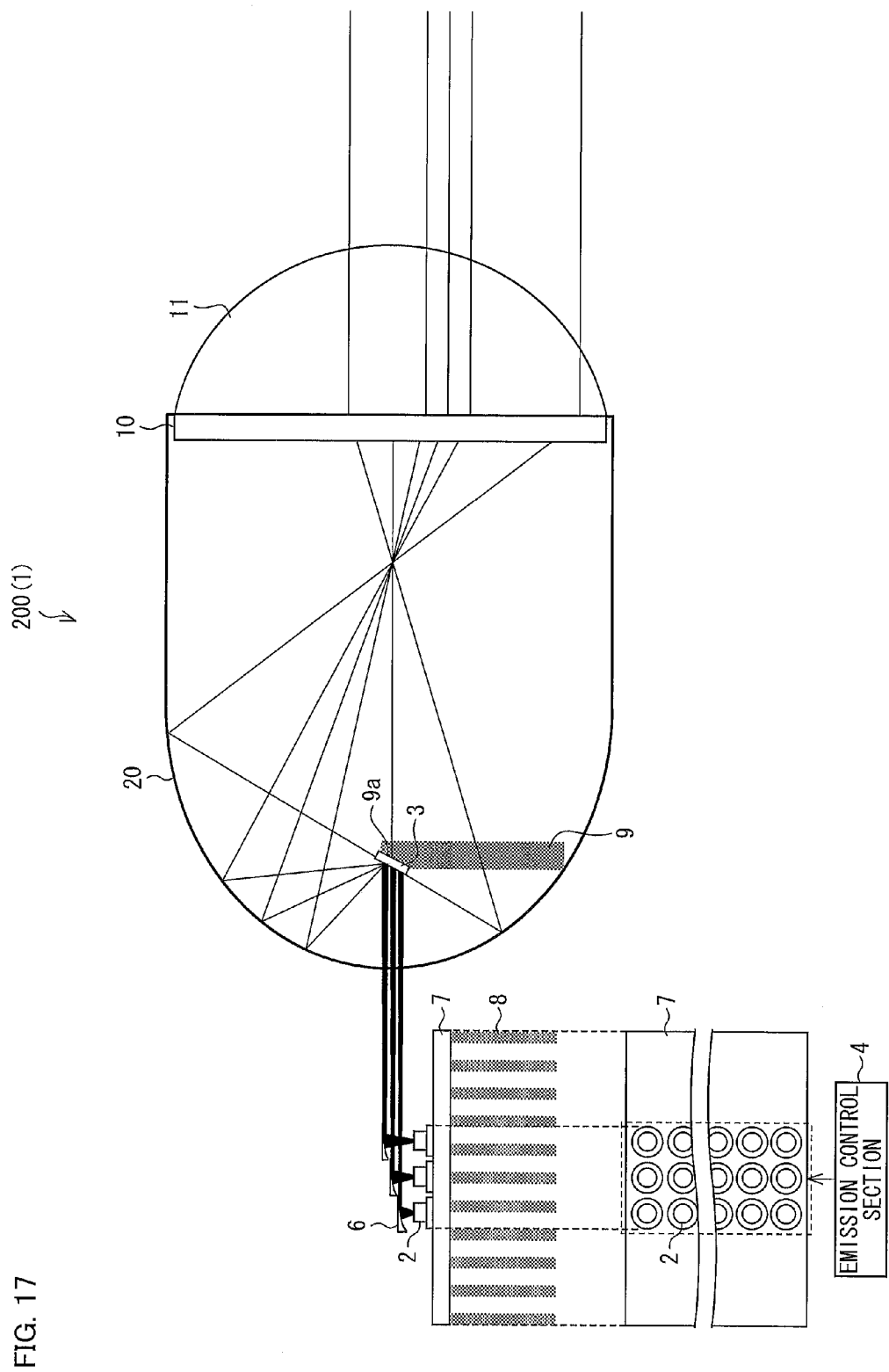

FIG. 17 is a schematic view illustrating a modification example of the headlamp in accordance with the present embodiment.

Figure 18:
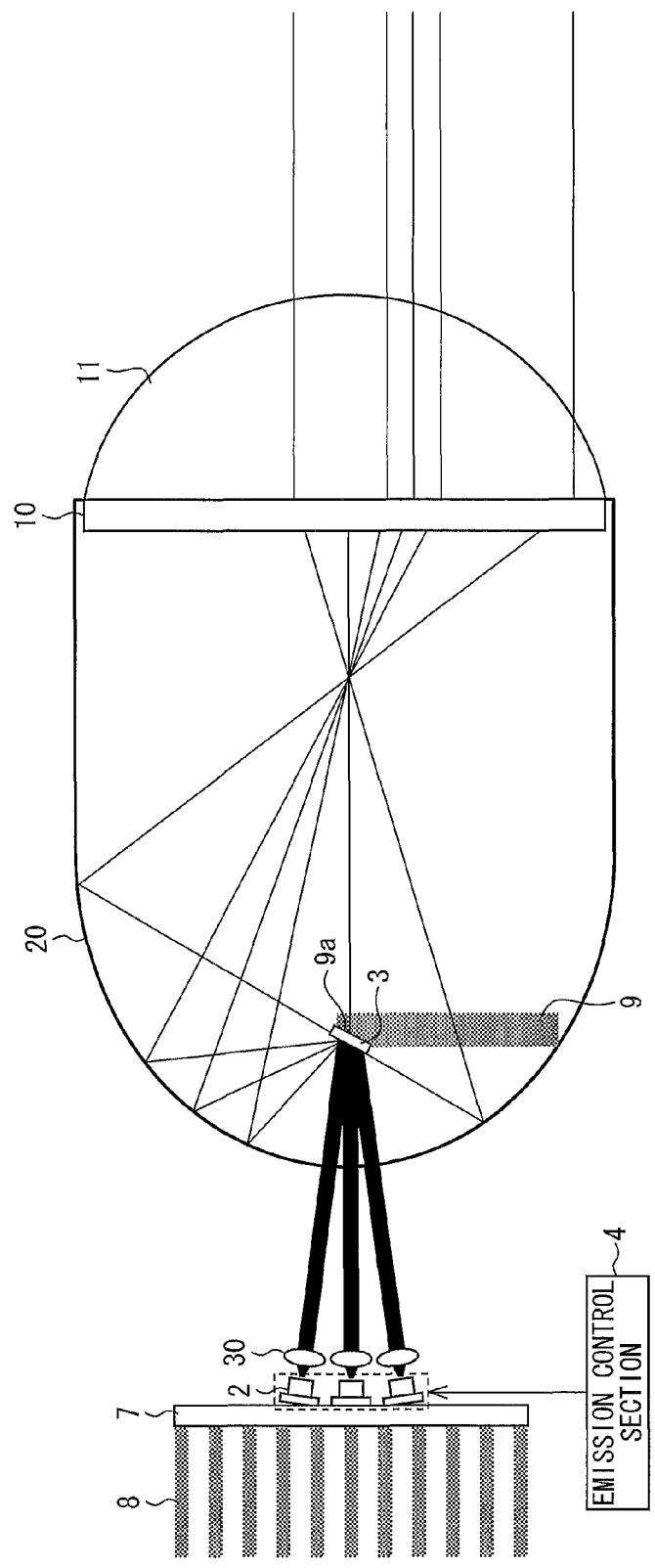

FIG. 18 is a schematic view illustrating another modification example of the headlamp in accordance with the present embodiment.

Figure 19:
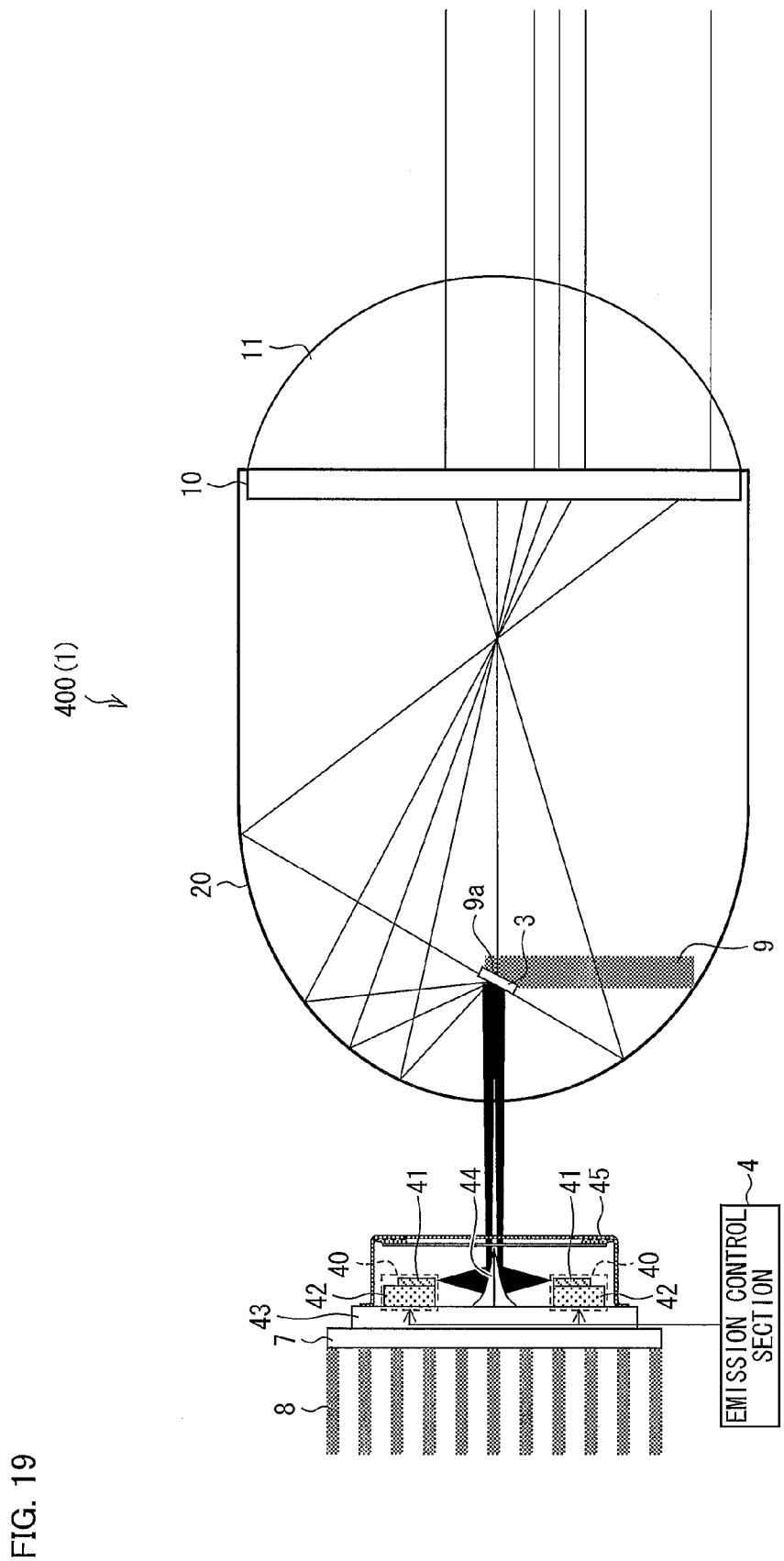

FIG. 19 is a schematic view illustrating still another modification example of the headlamp in accordance with the present embodiment.

FIG. 20

Figure 20:
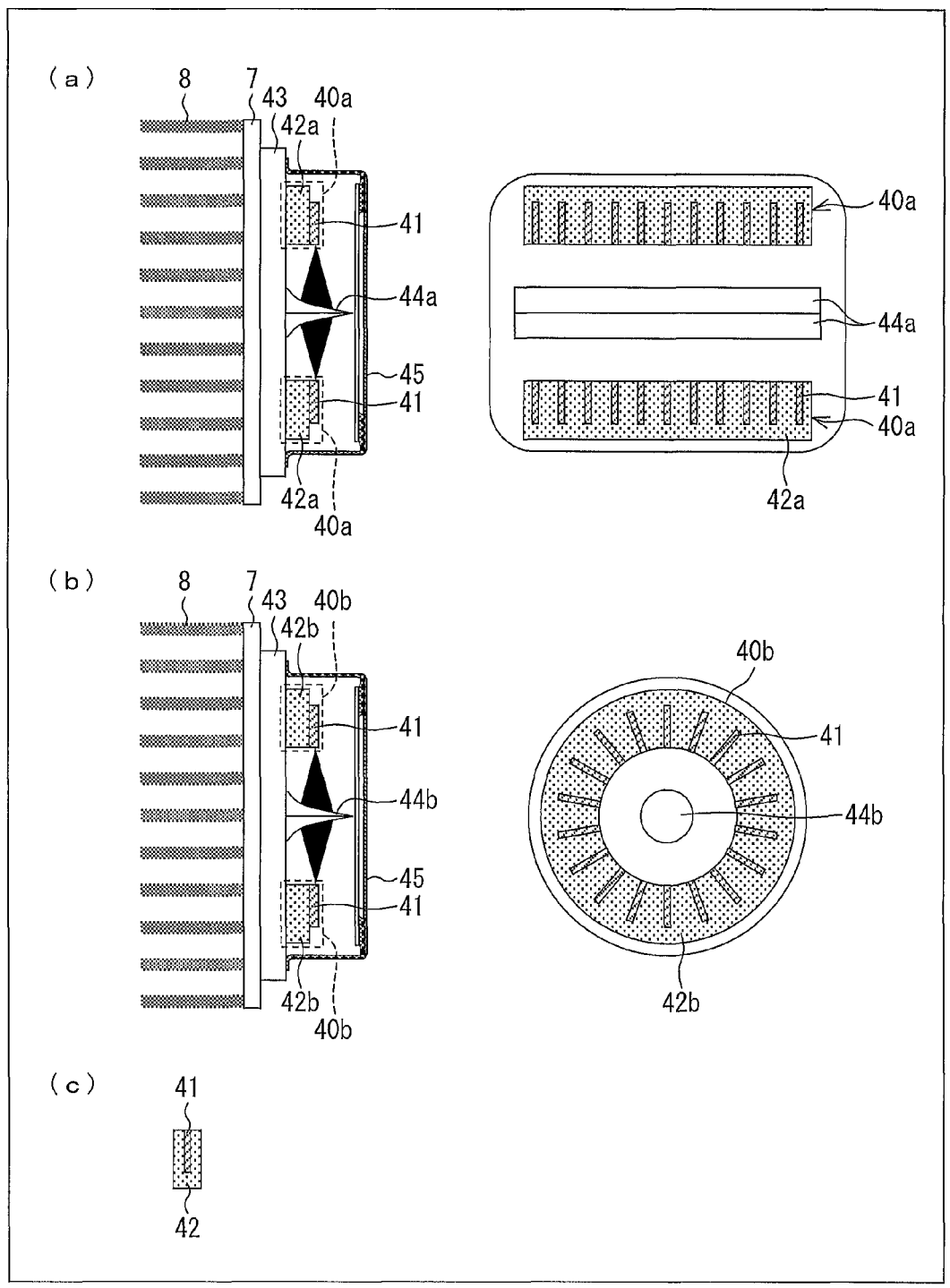

Each of (a) and (b) of FIG. 20 is a view schematically illustrating an example of a configuration in the vicinity of a laser element array included in the headlamp illustrated in FIG. 19. (c) of FIG. 20 is a view schematically illustrating an example of a configuration of one laser chip and one laser element array.

FIG. 21

Figure 21:
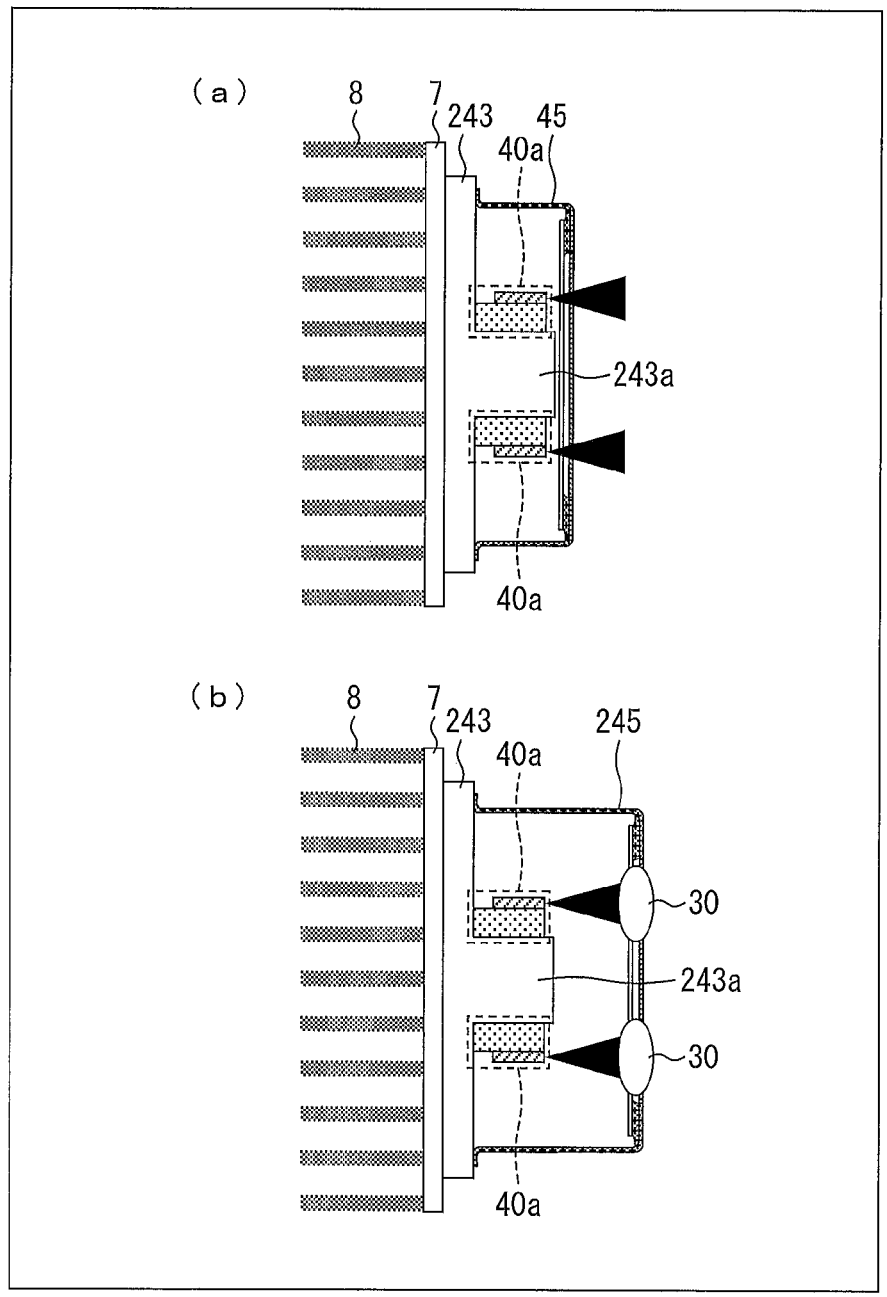

Each of (a) and (b) of FIG. 21 is a view illustrating other example of the configuration in the vicinity of the laser element array included in the headlamp illustrated in FIG. 19.

Figure 22:
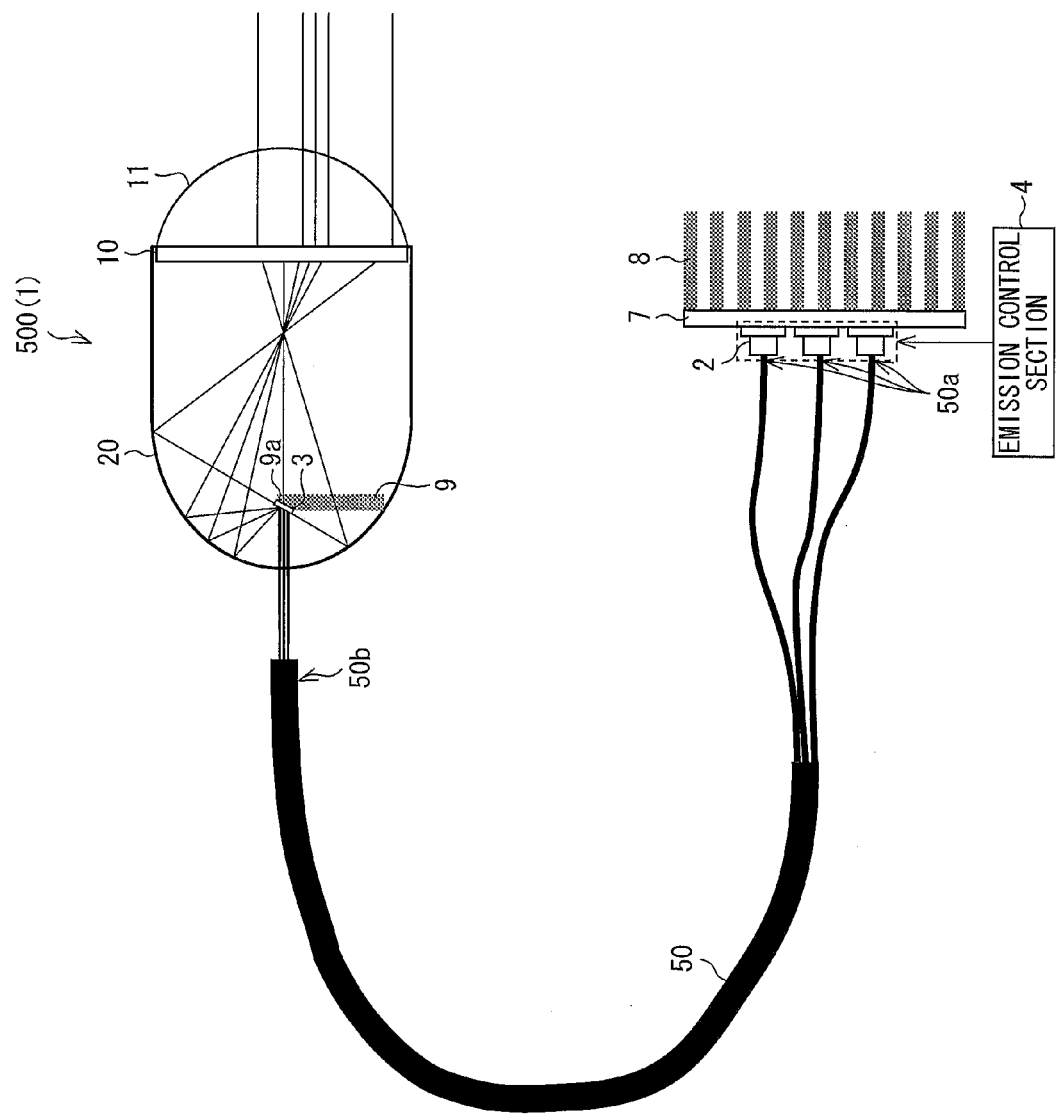

FIG. 22 is a schematic view illustrating still another modification example of the headlamp in accordance with the present embodiment.

DESCRIPTION OF EMBODIMENTS

With reference to drawings, the following description will discuss a light-emitting device 1 etc. in accordance with the present embodiment. Hereinafter, the same parts and the same members are given the same reference signs, and have the same names and the same functions. Accordingly, detailed explanations thereof are not repeated.

[Outline of Operation of Light-Emitting Device 1]

Initially, a description will be made below as to an outline of an operation of the light-emitting device 1 with reference to FIG. 2 etc., and then as to a specific configuration of a headlamp. The light-emitting device 1 in accordance with the present embodiment has a basic structure constituted by a plurality of laser elements 2, a light-emitting section 3, and an emission control section 4 (emission control means) (see FIG. 1). The light-emitting device 1 is included in each of headlamps 100-500 mentioned later.

Figure 2:
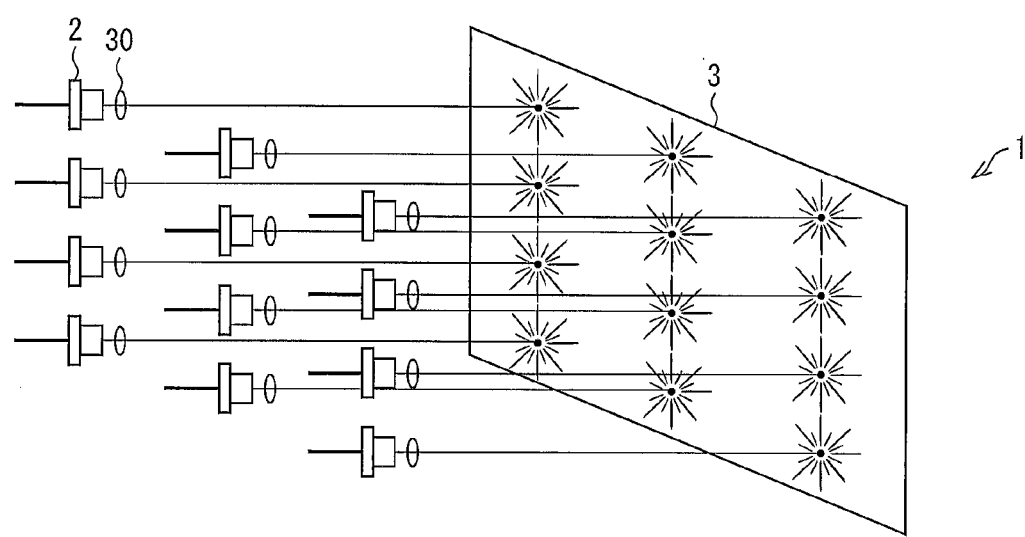
FIG. 2 is a view schematically illustrating a relation between a plurality of laser elements and a light-emitting section in a light-emitting device in accordance with the present embodiment.

FIG. 2 is a view schematically illustrating a relation between the plurality of laser elements 2 and the light-emitting section 3. In FIG. 2, the number of the laser elements 2 is twelve. However, the number is not limited to twelve. As illustrated in FIG. 2, in the light-emitting device 1, under control of the emission control section 4, the plurality of laser elements 2 provided in a matrix manner emit laser beams. The light-emitting section 3 emits fluorescence in response to the laser beams.

As illustrated in FIG. 2, the plurality of laser elements 2 are provided in a matrix manner with respect to the light-emitting section 3. Furthermore, light control sections (e.g. collimating lenses 30 in later-mentioned Modification Example 2 (see FIG. 18)) are positioned in such a manner as to correspond to the laser elements 2, respectively. Consequently, laser beams respectively emitted from the laser elements 2 are radiated to the whole of the light-receiving surface of the light-emitting section 3 in a matrix manner so that irradiation regions on the light-receiving surface do not overlap each other. Consequently, it is possible to cause a fluorescent body of the light-emitting section 3 to efficiently emit light, and control of emission of the laser elements 2 allows changing a range of floodlighting of illumination light in accordance with light distribution characteristics. Furthermore, it is possible to cause the light-emitting section 3 to uniformly emit light.

Figure 3:
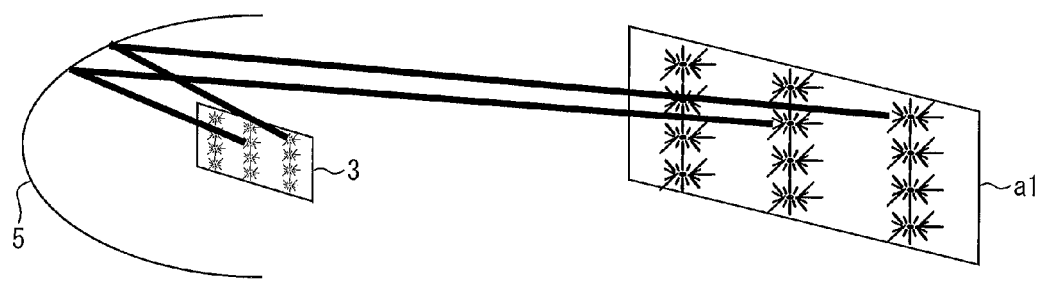
FIG. 3 is a view illustrating an example of an operation of the light-emitting device.
Figure 4:
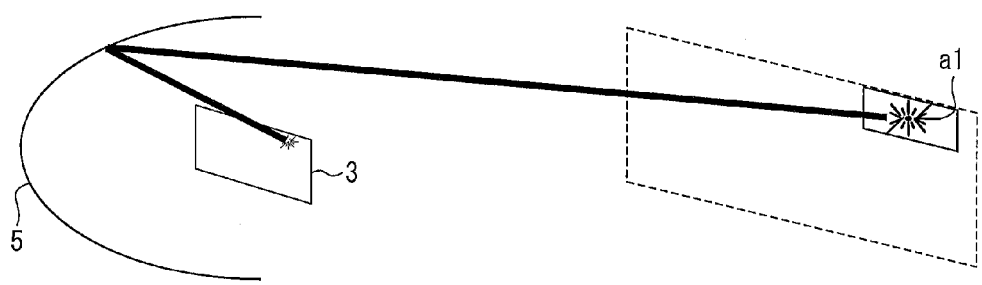
FIG. 4 is a view illustrating another example of an operation of the light-emitting device.
Figure 5:
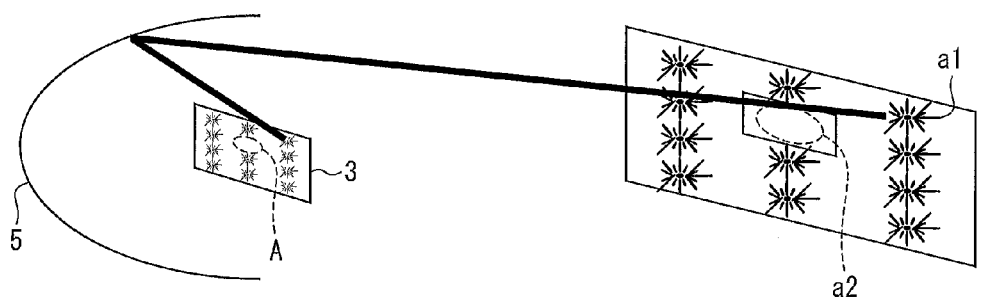
FIG. 5 is a view illustrating still another example of an operation of the light-emitting device.

FIGS. 3-5 illustrate Operation Examples of the light-emitting device 1. In FIGS. 3-5, for simplification, it is assumed that a parabolic mirror 5 (light-casting section) (see FIG. 1) is used for the light-emitting device 1, and the light-emitting section 3 is provided at substantially a focal position (first focal position) of the parabolic mirror 5.

In the light-emitting device 1, the emission control section 4 (mentioned later) determines whether each of the laser elements 2 is driven or not to control whether each of the laser elements 2 emits light or not, thereby changing areas irradiated with laser beams and positions irradiated with the laser beams on the light-emitting section 3. A range of floodlighting of light which has been emitted from the light-emitting section 3 and is reflected by the parabolic mirror 5 can be changed depending on a change in areas irradiated with laser beams or positions irradiated with the laser beams.

As illustrated in FIG. 3, when the emission control section 4 causes all of the laser elements 2 to emit laser beams, a range of floodlighting a1 with the maximum area is formed. In this case, irradiation regions formed on the light-receiving surface of the light-emitting section 3 are formed on all segments of the light-receiving surface, respectively.

FIG. 4 illustrates a range of floodlighting a1 formed when only a part of the plurality of laser elements 2 emits a laser beam. In FIG. 4, an irradiation region is formed to include only a part of the light-receiving surface of the light-emitting section 3 which part corresponds to a part of the laser elements 2 selected as a target to be driven by the emission control section 4 (e.g. only one segment of the light-receiving surface). The range of floodlighting a1 formed by illumination light emitted from the irradiation region is more limited in FIG. 4 than in FIG. 3.

FIG. 5 illustrates a range of floodlighting a1 formed when a part of the plurality of laser elements 2 emits a laser beam. Unlike FIG. 4, in FIG. 5, the emission control section 4 controls whether each of the plurality of laser elements 2 emits a laser beam or not so that only one segment of the light-receiving surface (region A in FIG. 5) is not irradiated with the laser beam. In this case, the range of floodlighting a1 is formed in such a manner as to exclude a range a2 corresponding to the region A.

As described above, the light-emitting device 1 is designed such that the plurality of laser elements 2 are positioned in such a manner that irradiation regions of the light-emitting section 3 are positioned at least partially differently and each of the plurality of laser elements 2 are controlled to emit a laser beam or not, thereby freely changing a light distribution pattern of illumination light. Furthermore, use of the laser elements 2 enables the light-emitting device 1 to secure sufficient luminance, and inclusion of the light-emitting section 3 for emitting light in response to the laser beam enables the light-emitting device 1 to have improved color rendering property and higher contrast of light whose wavelength is other than that of the laser beam.

As described above, the light-emitting device 1 can emit light to only a predetermined position, and therefore can illuminate a necessary portion and does not illuminate an unnecessary portion. Therefore, the light-emitting device 1 can reduce power consumption of a later-mentioned headlamp.

[Schematic Structure of Headlamp]

Figure 1:
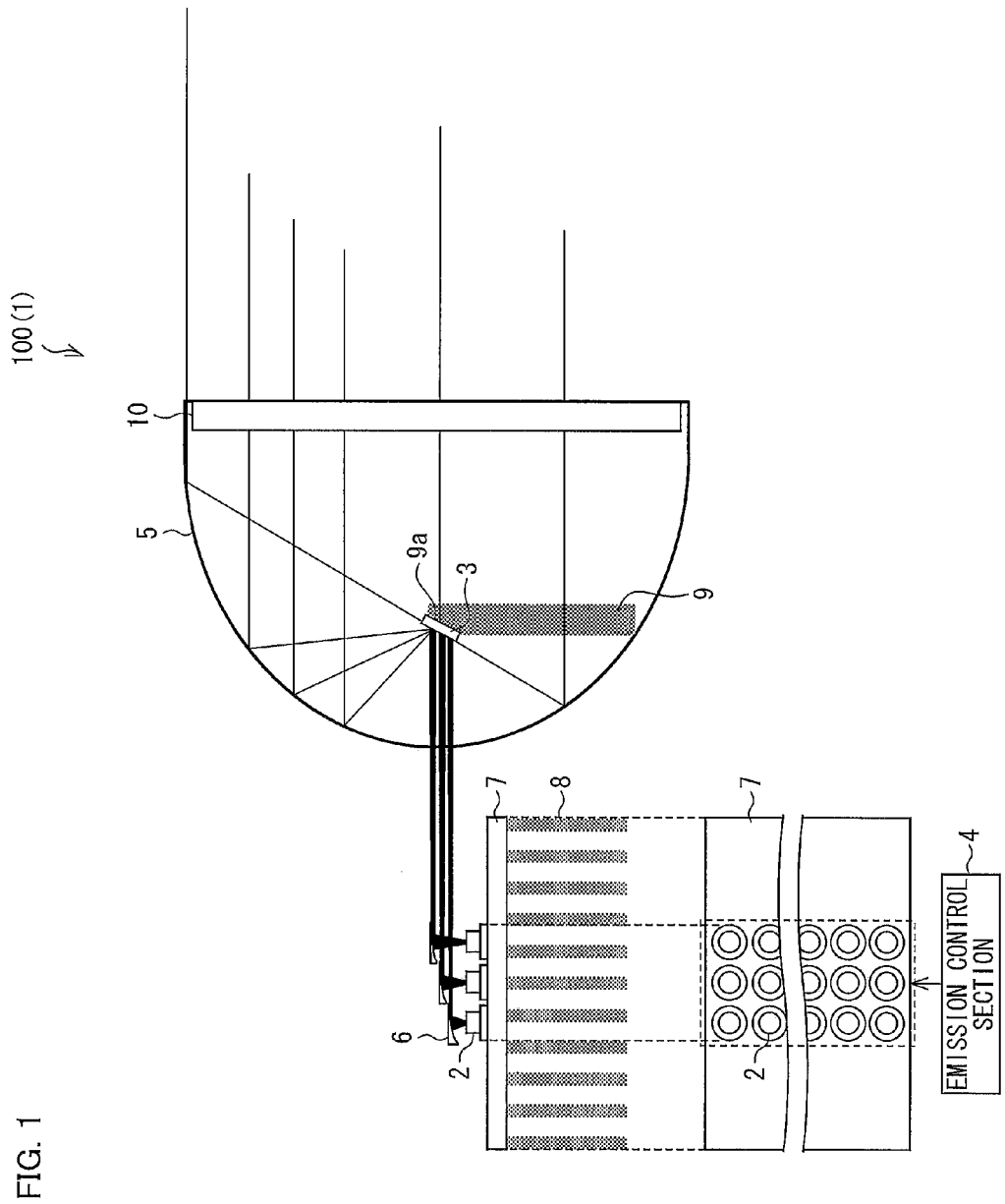
FIG. 1 is a view schematically illustrating an example of a headlamp in accordance with the present embodiment.

With reference to FIG. 1, the following description will discuss an example of a schematic structure of a headlamp 100 (light-emitting device, vehicle headlight) in accordance with the present embodiment. FIG. 1 is a view schematically illustrating an example of the headlamp 100 in accordance with the present embodiment.

As illustrated in FIG. 1, the headlamp 100 includes the laser elements 2, the light-emitting section 3, the emission control section 4, a parabolic mirror 5 (light-casting section), initial mirrors 6 (light control section, mirror), a heat radiating base 7 (heat radiating section), fins 8 (heat radiating section), a light-emitting section supporter 9, and a wavelength cut coating 10.

The headlamp 100 can generate illumination light from a laser beam emitted from the laser element 2, and control light distribution characteristics and light intensity distribution of the illumination light.

The headlamp 100 may be provided in plural at both ends of a front of an automobile (including motor cycle etc.) on which the headlamp 100 is mounted. For convenience, a description will be made below as to a case where one headlamp 100 is used for lighting.

(Laser Element 2)

The laser element 2 is a light-emitting element which functions as an excitation light source that emits a laser beam. The laser element 2 may have one light-emitting point for each chip or have a plurality of light-emitting points for each chip.

Use of a laser beam as excitation light allows efficiently exciting a fluorescent body contained in the later-mentioned light-emitting section 3 so as to emit light with higher luminance than a conventional light source, and further allows downsizing the light-emitting section 3. In the present embodiment, a laser beam emitted from one laser element 2 forms, on the light-emitting section 3 via the initial mirror 6, an irradiation region of 100 μm to 1000 μm in diameter (i.e. spot size of excitation light is 100 μm to 1000 μm in diameter).

The headlamp 100 illustrated in FIG. 1 includes the plurality of laser elements 2, and each of the plurality of laser elements 2 emits a laser beam as excitation light. Since the laser element 2 is a high luminance light source, it can efficiently narrow an irradiation region on the light-receiving surface of the light-emitting section 3. This allows casting light with a narrow distribution angle.

In the present embodiment, the number of the laser elements 2 is twenty-four. That is, laser beams respectively emitted from the laser elements 2 form twenty-four irradiation regions on the light-receiving surface. The light-receiving surface is a surface of the light-emitting section 3 which surface receives laser beams. The laser elements 2 are positioned on the heat radiating base 7 in such a manner that the twenty-four irradiation regions are formed uniformly (in a 8×3 matrix manner) on the light-receiving surface. This allows exciting the fluorescent body of the light-emitting section 3 in a matrix manner by the laser beams emitted from the plurality of laser elements 2. The number of the laser elements 2 is not limited to twenty-four and may be any number as long as the number can realize radiation of the laser beams to the whole of the light-receiving surface of the light-emitting section 3.

The wavelength of the laser beam from the laser element 2 is 395 nm (blue-violet) or 450 nm (blue) for example. However, the wavelength is not limited to them, and may be selected suitably according to the kind of the fluorescent body contained in the light-emitting section 3.

The laser element 2 is mounted on a metal package of 5.6 mm in diameter, and emits a laser beam with an output of 2 W and a wavelength of 395 nm (blue violet, 380-415 nm). The laser element 2 is connected with a wire, and receives a power etc. via the wire.

The wavelength is not limited to 395 nm, and may be selected suitably according to the fluorescent body used in the light-emitting section 3.

In FIG. 1, the plurality of laser elements 2 are positioned uniformly on the heat radiating base 7. However, the present invention is not limited to this configuration, and a distance between adjacent laser elements 2 may be determined individually.

(Heat Radiating Base 7)

The heat radiating base 7, which is a supporting member for supporting the plurality of laser elements 2, is made of metal (e.g., aluminum or copper). Therefore, the heat radiating base 7 is highly thermally conductive and can efficiently radiate heat generated in the plurality of laser elements 2 provided thereon.

Note that a member supporting the laser element 2 may be a member containing a highly thermally conductive substance (e.g., silicon carbide or aluminum nitride) other than metal. However, it is more preferable that the member supporting the laser element 2 be made of, for example, highly thermally conductive metal.

(Fin 8)

The fin 8, which is provided on the heat radiating base 7, functions as a cooling section (heat radiating mechanism) which cools heat transferred from the laser element 2 to the heat radiating base 7. The fin 8, which has a plurality of heat radiating plates, enhances heat radiating efficiency by increasing an area of a contact part with atmosphere.

In the present embodiment, the heat radiating base 7 and the fins 8 are integrally molded by aluminum die casting, and the laser elements 2 are provided on them via Si paste (insulating thermal-conductive resin).

Note that the fin 8 does not necessarily need to abut on the heat radiating base 7 and that a heat pipe, a water-cooled pipe, a Peltier device, or the like may be provided between the heat radiating base 7 and the fin 8. It is only necessary that the cooling section which cools the heat radiating base 7 have a cooling function (heat radiating function). The cooling section which cools the heat radiating base 7 in a water-cooling mode may perform cooling by use of a radiator. Alternatively, the cooling section may perform forced cooling by use of, for example, a fan.

(Initial Mirror 6)

The initial mirrors 6 are positioned between the plurality of laser elements 2 and the light-emitting section 3, and control guide of laser beams from the plurality of laser elements 2 to the light-emitting section 3. In other words, the initial mirrors 6 reflect laser beams from the plurality of laser elements 2, respectively, thereby controlling guide of the laser beams.

Specifically, laser beams emitted from the plurality of laser elements 2 respectively are reflected by the initial mirrors 6 to be substantially collimated beams with a narrower width in a longitudinal direction, and then guided to the light-emitting section 3 via a window of the parabolic mirror 5.

This configuration allows the plurality of laser elements 2 to be positioned freely with respect to the light-emitting section 3.

(Structure of Initial Mirror 6)

In the present embodiment, the initial mirror 6 is an off-axis parabolic mirror whose focal point is substantially equal to a light-emitting point of the laser element 2. The initial mirror 6 converts a laser beam from the laser element 2 into a collimated beam and controls a light path of the collimated beam. It is more preferable that the initial mirror 6 is an aspheric mirror capable of correcting an astigmatic difference of the laser element 2 (laser chip) and converting a laser beam into a collimated beam. This configuration can further improve a collimating property. Alternatively, the initial mirror 6 may be other parabolic mirror.

Since the plurality of laser elements 2 are provided on the heat radiating base 7, the plurality of initial mirrors 6 are provided in such a manner as to correspond to the laser elements 2 respectively so as to face light-emitting points of the laser elements 2 respectively.

(Function of Initial Mirror 6)

As described above, the initial mirror 6 in accordance with the present embodiment converts a diverging beam (laser beam emitted from the laser element 2) into a collimated beam. Furthermore, use of the initial mirror 6 allows downsizing the window of the parabolic mirror 5.

A light path of a laser beam from the laser element 2 to the light-emitting section 3 illustrated in FIG. 1 is considered specifically. The widths of three laser beams (in lateral direction on paper) emitted from the laser elements 2 depend on the distance between the laser elements 2. However, the widths of the three laser beams having been reflected by the initial mirror 6 are reduced (in longitudinal direction on paper). This allows downsizing the window of the parabolic mirror 5, realizing effective use of light emitted from the light-emitting section 3.

Since the headlamp 100 is a light source for a vehicle headlamp, the headlamp 100 is required to have a laterally long light distribution finally as illustrated in FIG. 13. Therefore, the initial mirror 6 reflects a laser beam from the laser element 2 in such a manner that the laser beam is compressed in a longitudinal direction to have a laterally longer shape on the light-emitting section 3.

As described above, the initial mirror 6 in accordance with the present embodiment has two functions of collimating a diverging beam and compressing the beam in a longitudinal direction.

FIG. 1 illustrates a configuration including the initial mirrors 6. Alternatively, the function similar to the initial mirror 6 can be realized by using a collimating lens and a plane mirror. Alternatively, in a case where a collimating lens or a collimating mirror is provided inside the laser element 2 to enable the laser element 2 to emit a collimated beam, the function similar to the initial mirror 6 can be realized by using a plane mirror.

Furthermore, use of the initial mirror 6 in controlling guide of a laser beam allows reducing deterioration in a coating film than use of the collimating lens 30. Therefore, use of the initial mirror 6 is desirable in consideration of securing long-term reliability.

(Material of Initial Mirror 6)

The initial mirror 6 is obtained by coating AlN ceramics which is a substrate with (i) Al which is a reflective film and (ii) aluminum oxide which is an antioxidant film. However, the present invention is not limited to this.

Desirable examples of the substrate are materials with small thermal expansion coefficient, such as glasses (e.g. BK7, silica glass), polycarbonate, acrylic, FRP, SiC, and $Al_2O_3$. In a case where ultimate collimating accuracy is not required so exactly, metals such as Al may be used.

The reflective film is desirably a metal such as Ag and Pt. The reflective film may be a film having a multilayered structure, such as $SiO_2/TiO_2$ multilayered film.

The antioxidant film may be made of silicon oxide etc. The antioxidant film is not necessarily coated.

The initial mirror 6 may be provided with an enhanced reflective film (enhanced reflection structure, such as HR coated film) on its surface. This configuration allows reducing reflection loss (mirror loss) of a laser beam due to the initial mirror 6.

(Description on Irradiation Region)

That is, at least a part of the plurality of laser elements 2 may be positioned in such a manner that irradiation regions of the light-emitting section 3 which are respectively irradiated with the laser beams emitted from the plurality of laser elements 2 are positioned at least partially differently.

Figure 6:
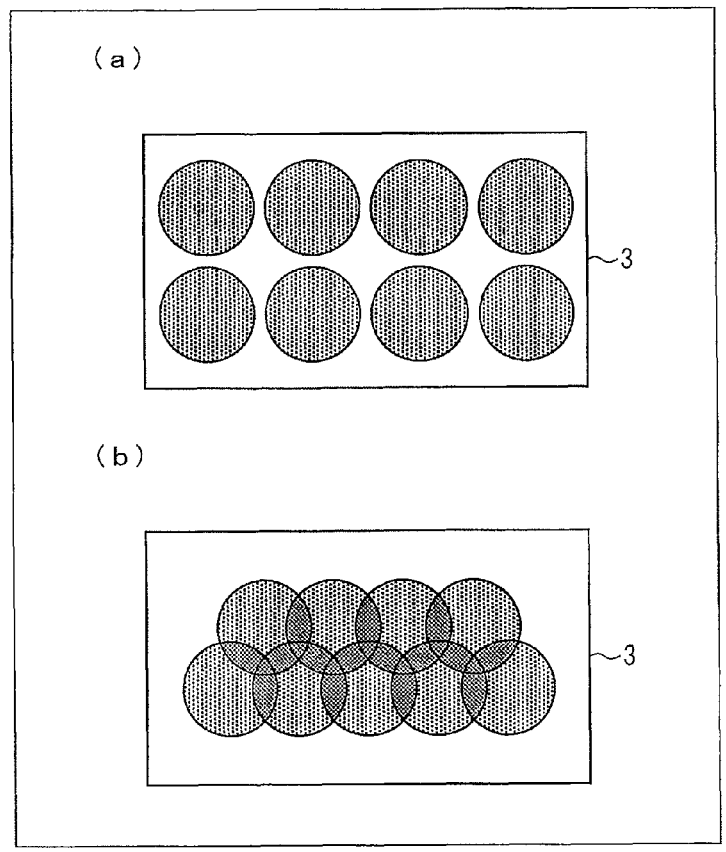
FIG. 6 Each of (a) and (b) of FIG. 6 illustrates an example of a positional relationship among a plurality of irradiation regions formed on a light-emitting section.

That is, as illustrated in (a) of FIG. 6, the plurality of laser elements 2 may be positioned in such a manner that all irradiation regions which are respectively irradiated with laser beams from the laser elements 2 are positioned differently or, as illustrated in (b) of FIG. 6, the plurality of laser elements 2 may be positioned in such a manner that at least a part of each of the irradiation regions is overlapped with each other and other part of each of the irradiation regions is positioned differently. Furthermore, although not illustrated, the plurality of laser elements 2 may be positioned in such a manner that some of the plurality of irradiation regions are partially overlapped with each other and others of the plurality of irradiation regions are positioned wholly differently.

It is desirable when an irradiation region formed by a laser beam emitted from one laser element 2 is required to have higher luminance on the light-emitting section, the irradiation region has a smaller area.

In FIG. 6, for convenience, the number of irradiation regions, i.e. the number of laser elements 2 which has formed the irradiation regions, respectively, is smaller than the number of laser elements 2 in FIG. 1.

(Light-Emitting Section 3)

The light-emitting section 3 emits fluorescence in response to a laser beam emitted from the laser element 2. That is, the light-emitting section 3 emits light in response to a laser beam emitted from at least one of the plurality of laser elements 2.

The light-emitting section 3 contains a fluorescent body (fluorescent substance) which emits fluorescence by absorbing a laser beam.

For example, the light-emitting section 3 is a light-emitting body containing a fluorescent body, such as a light-emitting body having particles of a fluorescent body dispersed inside a sealant (sealed type), a light-emitting body obtained by solidifying particles of a fluorescent body, or a light-emitting body obtained by applying (depositing) particles of a fluorescent body onto a substrate made of a highly thermally conductive material (thin-film type). In the present embodiment, the light-emitting section 3 is formed by applying powder of a fluorescent body on a tilt section 9a of the light-emitting section supporter 9 using $TiO_2$ as a binder in such a manner as to be a rectangular thin film of 4 mm×2 mm with a thickness of 0.1 mm.

The light-emitting section 3 is positioned by the light-emitting section supporter 9 in such a manner as to be close to the focal point of the parabolic mirror 5. Therefore, fluorescence emitted from the light-emitting section 3 is reflected by a reflection curved surface of the parabolic mirror 5, so that an optical path of the fluorescence is controlled.

As illustrated in FIG. 1, the light-emitting section 3 is preferably smaller than the parabolic mirror 5 (e.g. approximately one-tenth of the parabolic mirror 5). In this case, it is possible to efficiently cast light from the light-emitting section 3 ahead of the parabolic mirror 5.

Furthermore, the light-emitting section 3 is desirably larger than irradiation regions (laser beam irradiation range) irradiated with laser beams emitted from all the laser elements 2.

(Tilt Positioning of Light-Emitting Section 3)

The light-emitting section 3 is positioned at a tilt on the tilt section 9a of the light-emitting section supporter 9 in such a manner as to enable fluorescence from the light-emitting section 3 to be efficiently reflected by the parabolic mirror 5 and is cast by the parabolic mirror 5. The tilt section 9a is tilted by approximately 15° in an incident direction of a laser beam with respect to a plane perpendicular to the incident direction. Light emitted from the light-emitting section 3 has a substantially lambertian distribution. Accordingly, if the tilt section 9a is formed in such a manner that a laser-beam-irradiation plane of the tilt section 9a is perpendicular to the incident direction of the laser beam, a region with the highest luminous intensity out of light emitted from the light-emitting section 3 is positioned at the window of the parabolic mirror 5, resulting in lower floodlighting efficiency.

In consideration of the floodlighting efficiency, it is desirable that the laser-beam-irradiation plane is tilted by approximately 15°. If the floodlighting efficiency is not taken into consideration, the tilt section 9a may be formed in such a manner that the laser-beam-irradiation plane of the tilt section 9a is perpendicular to the incident direction of the laser beam.

In a case where the window of the parabolic mirror 5 is designed to have a structure capable of transmitting a laser beam and reflecting light emitted from the light-emitting section 3, even if the tilt section 9a is formed in such a manner that the laser-beam-irradiation plane of the tilt section 9a is perpendicular to the incident direction of the laser beam, the floodlighting efficiency would be improved, although production costs increase.

(Fluorescent Body)

The present embodiment uses BAM ($BaMgAl_{10}O_{17}$: Eu), BSON ($Ba_3Si_6O_{12}N_2$: Eu), or Eu-α (Ca-α-SiAlON: Eu) as the fluorescent body of the light-emitting section 3 so that the fluorescent body emits white fluorescence in response to laser beams which have been generated by the respective laser elements 2 and each have a wavelength of 395 nm. The fluorescent body of the light-emitting section 3 is, however, not limited to the above, and may be so selected as appropriate that the headlamp 100 for an automobile emits white illumination light having a chromaticity within a predetermined range stipulated in the related law(s).

For example, it is possible to use another oxynitride fluorescent body (e.g., a sialon fluorescent body such as JEM ($LaAl(SiAl)_6N_9O$: Ce) or β-SiAlON), a nitride fluorescent body (e.g., a CASN ($CaAlSiN_3$: Eu) fluorescent body), a SCASN ((Sr,Ca) $AlSiN_3$: Eu) fluorescent body), an Apataite (($(Ca,Sr)_5(PO_4)_3Cl$: Eu), or a III-V group compound semiconductor nanoparticle fluorescent body (e.g., indium phosphide: InP).

Alternatively, white light can be obtained by incorporating a yellow fluorescent body (or green and red fluorescent bodies) into the light-emitting section 3 and irradiating the light-emitting section 3 with a laser beam of 450 nm (blue) (or so-called near-blue laser beam whose peak wavelength is in a range of not less than 440 nm and not more than 490 nm).

(Sealed Type)

A sealing material of which the light-emitting section 3 of a sealed type is made is, for example, a resin material such as a glass material (e.g., inorganic glass or organic/inorganic hybrid glass) or a silicone resin. Low-melting glass may also be used as the glass material. The sealing material is preferably highly transparent, and is preferably highly heat-resistant in a case where a laser beam is high in output. The light-emitting section 3 may be sealed with, for example, silicon oxide or titanium oxide by a sol-gel process.

The light-emitting section 3 may have, on a top surface thereof, an anti-reflection structure which prevents reflection of a laser beam. In the case of a sealed-type light-emitting body, since it is easy to control a shape of the top surface of the light-emitting section 3, it is particularly desirable to form an anti-reflection film.

(Thin-Film Type)

In a case where the light-emitting section 3 is a thin-film type light-emitting body, Al, Cu, AlN ceramic, SiC ceramic, aluminum oxide, Si, or the like is used as a substrate. Fluorescent body particles are applied to or deposited on the substrate, and then the substrate is divided into substrates each having a desired size. Thereafter, the substrates are fixed to the light-emitting section supporter 9 by use of a highly thermally conductive adhesive.

In a case where Al or Cu, for example, is used as the substrate, it is desirable that a side of the substrate on which side no fluorescent body particles are deposited (a side of the substrate which side faces the light-emitting section supporter 9) be coated with TiN, Ti, TaN, Ta, or the like as a barrier metal. Further, the barrier metal may be coated with Pt or Au, for example.

It is desirable to use, as a highly thermally conductive adhesive, eutectic solder of SnAgCu, AuSn, or the like. However, the highly thermally conductive adhesive is not limited to those.

(Spot Size of Excitation Light)

In the present embodiment, an irradiation region (spot size of excitation light) on the light-emitting section 3 has a diameter of 100-1000 μm. The reason is as follows.

1) Minimum Size

In order to emit white light, a plurality of fluorescent bodies are used in the light-emitting section 3. The grain size of each fluorescent body is approximately 10 μm. When three kinds of fluorescent bodies are used in the light-emitting section 3 for emitting white light uniformly, even if the three kinds of fluorescent bodies are blended in ratios of 1:1:1, the size of an irradiation region is required to be of 20 μm in diameter. In reality, since the blend of the fluorescent bodies is changed according to a necessary color temperature, the size of an irradiation region required to emit white light is of approximately 50 μm in diameter. Furthermore, use of the fluorescent bodies without any treatment may generate, depending on a range of floodlighting, a color distribution corresponding to distributions of individual fluorescent particles. Therefore, it is desirable that the laser beam is radiated so that the size of the irradiation region is of 100 μm or more in diameter.

2) Maximum Size

This is a value determined according to a range of floodlighting which one laser element 2 is capable of forming.

(Size of Irradiation Region in Case of Using Blue Laser Element)

In a case of using the laser element 2 which emits a near-blue laser beam (blue laser element), since a laser beam is cast, it is necessary to set an output of the laser beam to be class 1 of IEC60825-1.

In a case where the laser element 2 mixes a blue laser beam with a blue-violet laser beam (in a case where the laser element 2 includes a blue laser element and a blue-violet laser element), it is desirable in consideration of a light emission efficiency that regions of individual fluorescent bodies in the light-emitting section 3 are positioned differently according to irradiation regions of individual laser beams. For example, a YAG fluorescent body is used for an irradiation region of a blue laser beam, and BAM, BSON, and Eu-α are used for an irradiation region of a blue-violet laser beam (i.e. these fluorescent bodies are applied separately).

In this case, it is desirable in terms of safety that the size of an irradiation region irradiated with a blue laser beam emitted from one blue laser element is equal to or larger than the size of an irradiation region irradiated with a blue-violet laser beam emitted from one blue-violet laser element.

If the light emission efficiency is not taken into consideration, individual fluorescent bodies may be blended and applied on the whole surface of the light-emitting section 3 instead of being applied separately (e.g. blend of YAG fluorescent body and BAM, BSON, and Eu-α).

(Emission of Light Other than White Light)

Light emitted from the light-emitting section 3 is not limited to white light. The light-emitting section 3 may emit light having chromaticity defined in a light-emitting device.

In a case where the laser element 2 includes an infrared emission laser element serving as an infrared camera light source, the light-emitting section 3 also serves as a scatterer for casting an infrared laser beam to a desired region.

(Light-Emitting Section Supporter 9)

The light-emitting section supporter 9 made of a highly thermal-conductive metal etc. supports the light-emitting section 3 at the tilt section 9a which is one end of the light-emitting section supporter 9, and is connected with the parabolic mirror 5 so that the light-emitting section 3 is substantially at a focal position of the parabolic mirror 5.

In the present embodiment, the light-emitting section supporter 9 is made of Al. Alternatively, the light-emitting section supporter 9 may be made of highly thermo-conductive ceramics such as AlN and SiC.

In the present embodiment, a fluorescent body is applied on the light-emitting section supporter 9 using titanium oxide as a binder, thereby fixing the light-emitting section 3. The binder also may be silicon oxide etc.

In a case where the light-emitting section 3 is a thin film, it is desirable that a plane of the light-emitting section supporter 9 which plane faces the light-emitting section 3 is coated with TiN, Ti, TaN, Ta etc. serving as a barrier metal. Furthermore, the barrier metal may be coated with Pt, Au etc.

The other end of the light-emitting section supporter 9 may be connected, via the parabolic mirror 5, to a heat radiating member (not illustrated) which is highly thermally conductive. Therefore, heat of the light-emitting section 3 which heat is generated by a laser beam is transmitted to each of the light-emitting section supporter and the heat radiating member, so that the heat is radiated efficiently.

(Parabolic Mirror 5)

The parabolic mirror 5 reflects and controls light emitted from the light-emitting section 3. Furthermore, the parabolic mirror 5 casts light to a light distribution area (light-castable range) which is a range in which the headlamp 100 (device including the parabolic mirror 5) can cast light. That is, the range of floodlighting a1 (see FIG. 3) is formed by illumination light which is emitted from the light-emitting section 3 in response to laser beams from the plurality of laser elements 2.

The parabolic mirror 5 casts illumination light emitted from the light-emitting section 3.

The parabolic mirror 5 reflects fluorescence emitted by the light-emitting section 3, and casts the reflected fluorescence to the light distribution area. The parabolic mirror 5 forms a light flux (illumination light) which travels in a predetermined solid angle. Accordingly, it is unnecessary to provide the headlamp 100 with a convex lens 11. That is, unlike a headlamp 200 of Modification Example 1 including an elliptic mirror 20 and the convex lens 11, the headlamp 100 controls light from the light-emitting section 3 to be substantially collimated light and casts the substantially collimated light only by using the parabolic mirror 5.

The parabolic mirror 5 may be a member on which a metal thin film is formed or may be a metal member.

Figure 7:
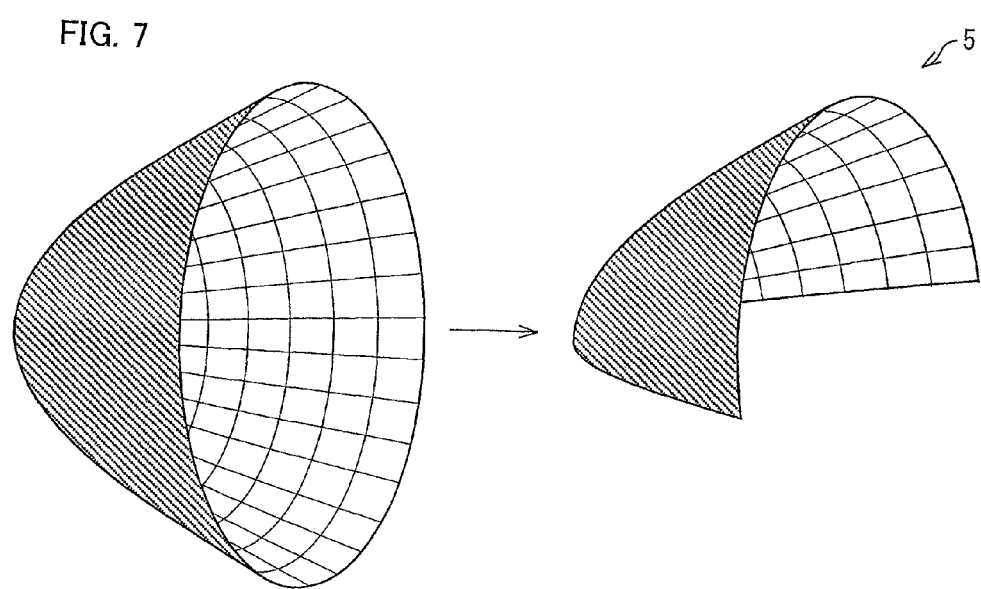
FIG. 7 is a view schematically illustrating a paraboloid of revolution of a parabolic mirror.

FIG. 7 is a conceptual diagram illustrating a paraboloid of revolution of the parabolic mirror 5. As illustrated in FIG. 7, the parabolic mirror 5 includes, in a reflection plane thereof, at least a part of a partial curved surface that is obtained by cutting, along a plane containing a rotation axis which is a symmetry axis of a parabola, a curved surface (parabolic curved surface) formed by causing the parabola to rotate around the rotation axis.

A part of the parabolic mirror 5 thus shaped is provided so as to face a top surface of the light-emitting section 3, the top surface being larger in area than a side surface of the light-emitting section 3. Namely, the parabolic mirror 5 is provided so as to cover the top surface of the light-emitting section 3 (so as to face an illuminated (light-receiving) surface that is a surface of the light-emitting section 3 to which surface a laser beam is emitted). From another viewpoint, at least a part of the parabolic mirror 5 is provided at a radiation angle at which light that is emitted from light-emitting section 3 has the highest luminous intensity when seen from the light-emitting section 3.

In a case where the light-emitting section 3 and the parabolic mirror 5 are provided in a positional relationship as described above, it is possible to efficiently cast fluorescence of the light-emitting section 3 in a given solid angle. This allows fluorescence to be used with higher efficiency.

(Half Parabolic Mirror)

The parabolic mirror 5 may be a half parabolic mirror or the like (described below) provided that the parabolic mirror 5 has a parabolic shape. The parabolic mirror 5 may also be an off-axis parabolic mirror or a multi-facet type parabolic mirror.

Figure 8:
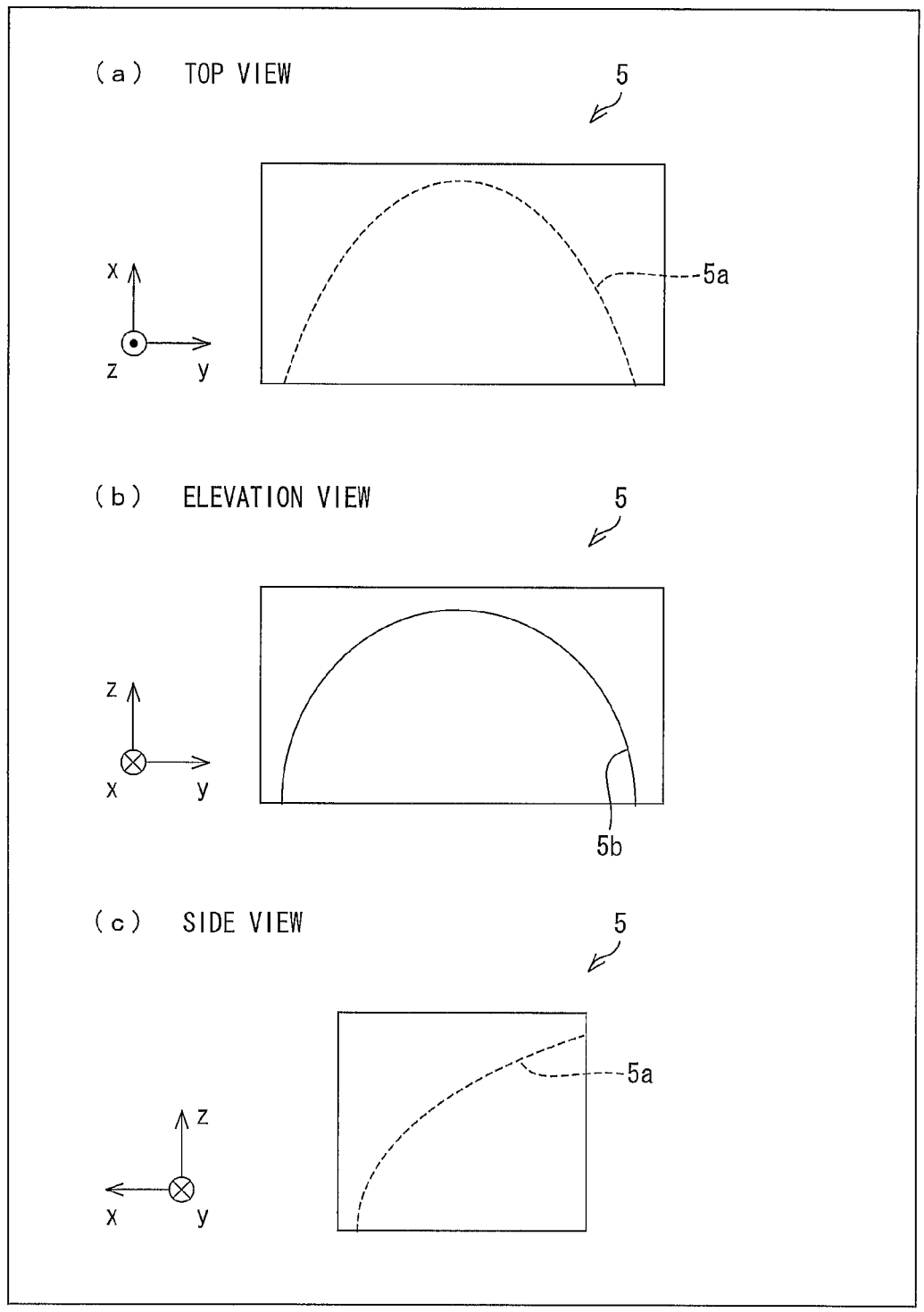
FIG. 8
(a) of FIG. 8 is a top view of a parabolic mirror. (b) of FIG. 8 is an elevation view of the parabolic mirror. (c) of FIG. 8 is a side view of the parabolic mirror.

(a) of FIG. 8 is a top view of the parabolic mirror 5, (b) of FIG. 8 is an elevation view of the parabolic mirror 5, and (c) of FIG. 8 is a side view of the parabolic mirror 5. (a) to (c) of FIG. 8 show examples in each of which for simple illustration of an explanatory view, the parabolic mirror 5 has been formed by hollowing a member which is a rectangular parallelepiped.

In each of (a) of FIG. 8 and (c) of FIG. 8, a curved line indicated by a sign 5a shows a parabolic curved surface. In a case where the parabolic mirror 5 is seen from the front, an opening 5b (exit via which illumination light outgoes) thereof is semicircular (see (b) of FIG. 8).

(Window of Parabolic Mirror 5)

The parabolic mirror 5 has a window (not illustrated) via which a laser beam is transmitted or passes. The window may be a penetrating hole or may include a transparent member capable of transmitting a laser beam. For example, the window may be a transparent plate having a filter which transmits a laser beam and reflects white light (fluorescence from light-emitting section 3). This configuration allows preventing light emitted from the light-emitting section 3 from leaking out of the window.

The parabolic mirror 5 is an optical member suitable for converting light from near-focal point of the mirror into substantially collimated light. On the other hand, the parabolic mirror 5 exhibits great aberration with respect to light far from the focal point. Consequently, light far from the focal point is cast as a larger spot than light near the focal point even if they have the same luminance. Use of this phenomenon allows irradiating a range far from the light-casting axis (in case of vehicle headlamp, a close range in a side direction with respect to a travelling direction (e.g. range of floodlighting a3 in (b) of FIG. 11)) with a large spot.

In a case where such a property is not required, a spherical mirror, a multi-facet mirror etc. may be used. The light-casting section does not necessarily employ the parabolic mirror 5, and may select a suitable mirror according to the purpose of the light-emitting device. For example, the light-casting section may employ an elliptic mirror 20 illustrated in FIG. 17 or may employ a multi-facet mirror capable of generating any light distribution, a free-form surface mirror, a multi mirror etc.

(Substantially Parallel Light)

Substantially parallel light does not need to be completely parallel and may have an angle of floodlighting (a vertex angle at which a luminous intensity is halved) of 20° or less.

The present embodiment sets angles of floodlighting for respective elements constituting the laser elements 2. From the viewpoint of light-distribution control, the elements constituting the laser elements 2 are set to have respective angles of floodlighting each falling within a range of 0.1° to 20°. Particularly in a case of a vehicle headlamp, it is desirable to set the angle of floodlighting of each of the plurality of laser elements 2 which emit light in a vehicle-traveling direction (in a range of ±8° with respect to an axis of a vehicle) to be not more than 3° in order to realize a finer light distribution.

(Wavelength Cut Coating 10)

The wavelength cut coating 10 blocks light within a particular wavelength range. In the present embodiment, the wavelength cut coating 10 cuts light of 400 nm or less in wavelength, and blocks a laser beam of 395 nm in wavelength.

This provides a user with a device that is friendly to the human eye. What wavelengths to block may be selected as appropriate by selecting a desired kind of the wavelength cut coating 10. Further, the wavelength cut coating 10 may be replaced with a wavelength cut filter.

(Emission Control Section 4)

The emission control section 4 controls whether each of the plurality of laser elements 2 emits a laser beam or not. Furthermore, the emission control section 4 may control output of a laser beam from each of the plurality of laser elements 2. The emission control section 4 will be detailed later.

[Other Configuration of Headlamp 100]

Figure 9:
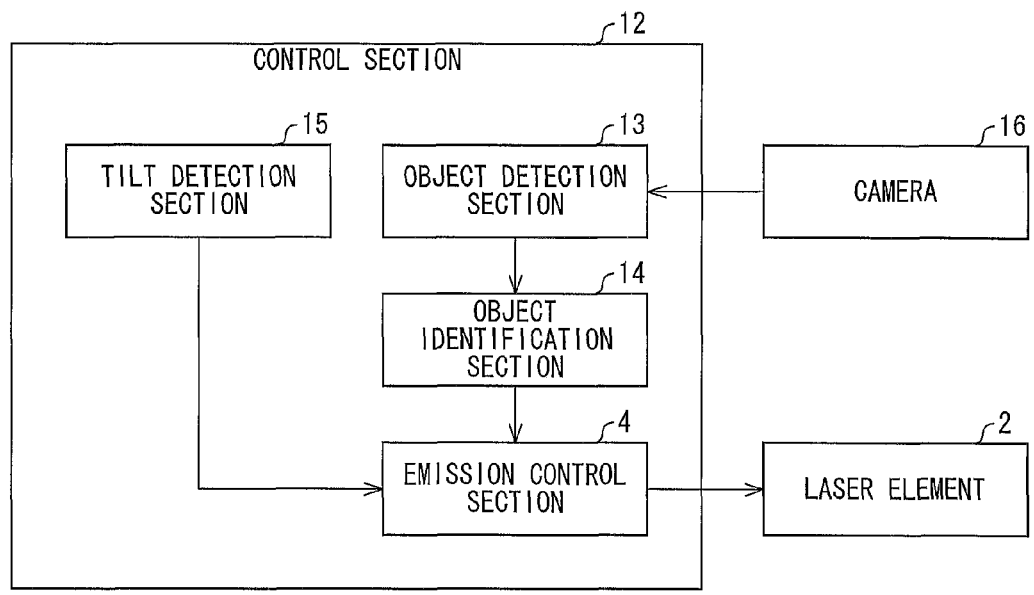
FIG. 9 is a block diagram illustrating an example of a control section included in the headlamp in accordance with the present embodiment.

With reference to FIG. 9, the following description will discuss other configuration of the headlamp 100 etc. in accordance with the present embodiment. FIG. 9 is a block diagram mainly illustrating an example of a control section 12 included in the headlamp 100. As illustrated in FIG. 9, the headlamp 100 includes the control section 12 and a camera 16 in addition to the aforementioned configuration.

(Camera 16)

The camera 16 continuously captures images of an area including a light-distribution area ahead of the vehicle. The camera 16 is positioned, for example, in a vicinity of a rear-view mirror provided forward of a room of the vehicle. The camera 16 may be a moving image capturing device used to capture a moving image at a television frame rate.

The camera 16 starts capturing an image upon radiation of a laser beam from the laser element 2, and outputs a captured motion image to the control section 12. The control section 12 can detect and identify a predetermined object by analyzing the motion image, and can generate a range of floodlighting a1 according to the result of the identification.

The camera 16 may be a camera for visible light, a camera for infrared light, or a camera for both visible light and infrared light. Designing the camera 16 to be for infrared light facilitates sensing homothermal animals including a human being.

The technique for identifying the kind of an object in a moving image captured by the camera 16 is not limited to the above, and may be a publicly known technique.

(Tilt Detection Section 15)

A tilt detection section 15 detects the tilt of a vehicle as a whole, particularly the tilt of a vehicle with respect to a horizontal plane. The tilt detection section 15 finds a tilt angle of a vehicle, and outputs an angle signal to the emission control section 4. The tilt detection section 15 detects the tilt of a vehicle by a publicly known method described in Japanese Patent Application Publication No. 2011-37337, Japanese Patent Application Publication No. 2009-204459, Japanese Patent Application Publication No. 2009-184463, Japanese Patent Application Publication No. 2005-283290 etc. The detection method is not particularly limited as long as the method can quickly respond to a positional change in vehicle.

(Control Section 12)

The control section 12 controls members constituting the headlamp 100 by executing a control program for example. The control section 12 mainly includes an object detection section 13 (detection means), an object identification section 14 (identification means), the tilt detection section 15, and the emission control section 4. The control section 12 carries out various processes by reading out a program stored in a storage section (not illustrated) in the headlamp 100 to, for example, a primary storage section (not illustrated) constituted by a RAM (Random Access Memory) etc. and executing the program according to necessity. The storage section 12 may be an external device connected with the light-emitting device 1 and the headlamp 100.

(Object Detection Section 13)

The object detection section 13 analyzes a motion image captured by the camera 16 so as to detect an object in the motion image. Specifically, the object detection section 13 acquires a motion image from the camera 16 and detects an object in a light distribution area of the motion image.

When the object detection section 13 detects an object in the light distribution area of the motion image, the motion detection section 13 outputs, to the object identification section 14, a detection signal indicative of coordinates at which the object is detected.

The camera 16 may be replaced with an infrared radiation radar that radiates an infrared ray to an object present in a light-distribution area and senses a reflected wave from that object. Alternatively, the camera 16 may be used in combination with such an infrared radiation radar. The case involving an infrared radiation radar can, similarly to the case involving the camera 16, also use a widely usable technique to sense an object present in a light-distribution area.

(Object Identification Section 14)

The object identification section 14 identifies, by image recognition, the kind of an object at coordinates indicated by the detection signal outputted from the object detection section 13. Specifically, the object identification section 14, upon obtaining a detection signal from the object detection section 13, extracts features (for example, moving speed, shape, and position) of the object indicated by the detection signal, and thus calculates a feature value, which is a numerical representation of the features.

Then, the object identification section 14 refers to a reference value table that manages reference values each of which is a numerical representation of the features of the kind of object, and retrieves, from the reference value table, a reference value having a difference from the calculated feature value which difference is within a predetermined threshold.

The reference value table manages, for example, respective reference values corresponding to a vehicle, a road sign, a pedestrian, an animal, and an expected obstacle and the like. The object identification section 14, in the case where it has identified a reference value having a difference from the calculated feature value which difference is within the predetermined threshold, determines that the object represented by that reference value is the object detected by the object detection section 13.

When the object identification section 14 determines that the object detected by the object detection section 13 is an object registered in the reference value table in advance, the object identification section 14 outputs, to the emission control section 4, an identification signal indicative of the object and coordinates at which the object is detected.

(Emission Control Section 4)

The emission control section 4 controls whether a laser element 2 corresponding to a detection region including the detected object emits light or not in accordance with the kind and position of the object indicated by the identification signal transmitted from the object identification section 14.

Specifically, in a case where the kind of an object indicated by the identification signal outputted from the object identification section 14 is an oncoming vehicle, a vehicle in front etc., the emission control section 4 controls a laser element 2 corresponding to a detection region where the oncoming vehicle, the vehicle in front etc. are detected in such a manner that the amount of casting light to a light distribution area corresponding to the detection region is in a level which a driver of the oncoming vehicle, the vehicle in front etc. does not feel glaring. That is, the emission control section 4 controls the laser element 2 in such a manner that the laser element 2 does not emit a laser beam or the laser element 2 emits a laser beam in a lower output level.

On the other hand, in a case where the kind of an object indicated by the identification signal outputted from the objection identification section 14 is a traffic sign, an obstacle etc., the emission control section 4 increases output of the laser element 2 which allows casting light to a light distribution area corresponding to a detection region where the traffic signal, the obstacle etc. are detected.

Furthermore, in accordance with the angle signal transmitted from the tilt detection section 15, the emission control section 4 controls the laser element 2 corresponding to a range of floodlighting a1 corresponding to the angle of a vehicle body indicated by the angle signal so that the laser element 2 emits or not.

Furthermore, even when the emission control section 4 does not receive the identification signal or the angle signal, the emission control section 4 controls each of the plurality of laser elements 2 whether to emit a laser beam or not in accordance with a desired light distribution pattern such as light distribution characteristics of a passing headlamp.

The following description will discuss Operation Examples 1-4 of the headlamp 100. It should be noted that Operation Examples 1-4 are merely examples and how the headlamp 100 operates is not limited to these examples.

Specific Operational Example 1

Figure 10:
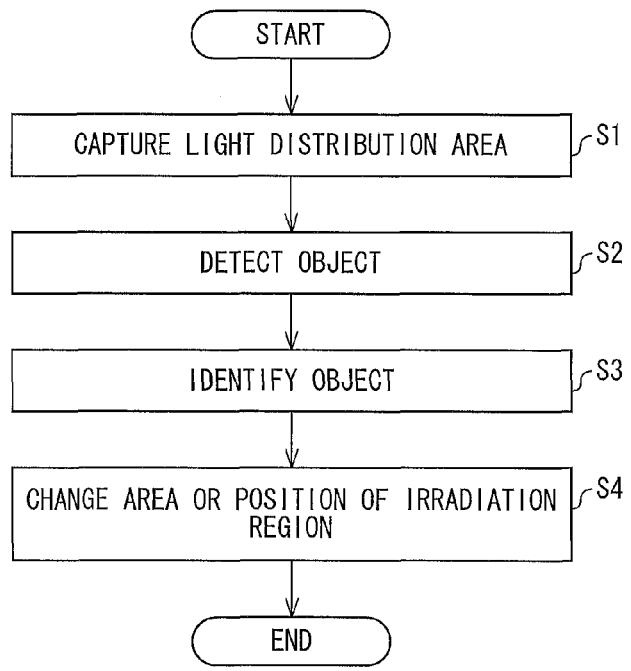
FIG. 10 is a flowchart showing an example of a flow of a process carried out by the headlamp in accordance with the present embodiment.
Figure 11:
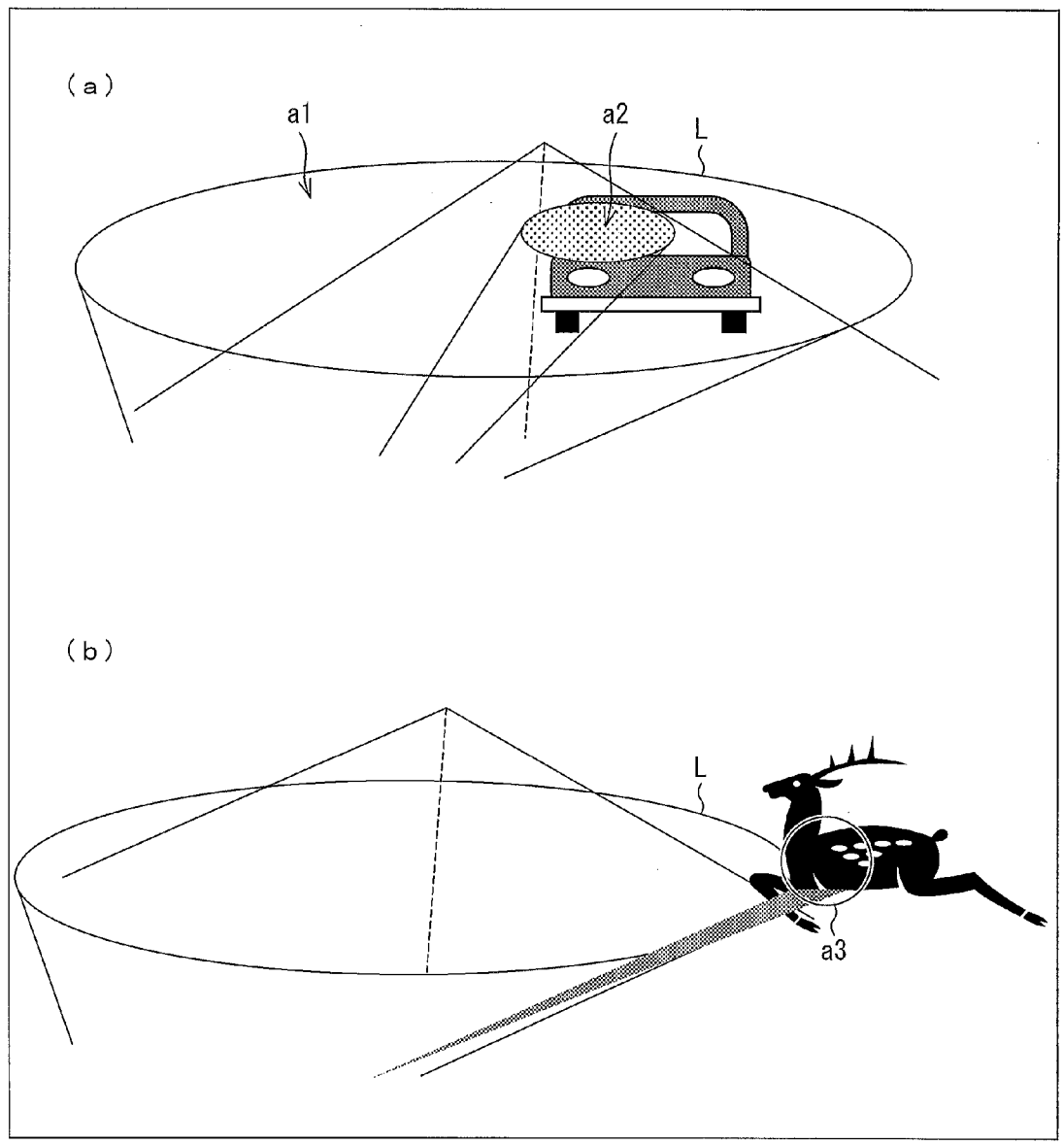
FIG. 11
(a) of FIG. 11 is a view illustrating an example of a range of floodlighting in a case where a vehicle including the headlamp in accordance with the present embodiment passes an oncoming vehicle. (b) of FIG. 11 is a view illustrating an example of a range of floodlighting in a case where the vehicle including the headlamp in accordance with the present embodiment detects an animal (risk factor) in front of the vehicle.

First, the following description deals with an example of how the emission control section 4 operates in accordance with an object detected by the object detection section 13, with reference to FIGS. 10 and 11. FIG. 10 is a view showing an example of a flow of a process carried out by the headlamp 100 in accordance with the present operational example. FIG. 11 is a schematic view illustrating an example of a range of floodlighting formed by the process carried out by the headlamp 100.

First, the camera 16 (i) captures a moving image of a light distribution area in front of a vehicle at an angle of view at which an image in front of the vehicle can be captured (S1), and (ii) transmits the moving image thus captured to the object detection section 13 (see FIG. 10).

Next, the object detection section 13 analyzes the moving image captured by the camera 16, so as to detect an object in the light distribution area (S2). In a case where the object detection section 13 detects an object in the light distribution area in the moving image, the object detection section 13 transmits, to the object identification section 14, a detection signal indicating coordinates at which the object has been detected.

Then, in a case where the object identification section 14 obtains the kind of the object at coordinates indicated by the detection signal received from the object detection section 13, the object identification section 14 identifies the kind of the object at the coordinates indicated by the detection signal (S3). That is, on receipt of the detection signal from the object detection section 13, the object identification section 14 works out a feature value by (i) extracting features of the object at the coordinates indicated by the detection signal, e.g., a moving speed of the object, a shape of the object, and a position of the object, and (ii) digitalizing the features thus extracted.

Then, the object identification section 14 refers to a reference table, so as to search such a reference value that a difference between the reference value and the feature value thus calculated is within a predetermined threshold. In a case where such a reference value that a difference between the reference value and the feature value thus calculated is within the predetermined threshold is found, the object identification section 14 determines that an object indicated by the reference value is identical with the object detected by the object detection section 13.

On the basis of a result of determination described above, the object identification section 14 supplies, to the emission control section 4, an identification signal indicating (i) the kind of the object indicated by the reference value and (ii) a detection region where the object has been detected. For example, in a case where the object identification section 14 identifies the kind of the object thus detected as an oncoming vehicle, as illustrated in (a) of FIG. 11, the object identification section 14 transmits, to the emission control section 4, an identification signal indicating a detection region corresponding to a region where the oncoming vehicle has been detected.

Next, on the basis of coordinate values indicated by the identification signal received from the object identification section 14, the emission control section 4 controls whether each of the plurality of the laser elements 2 emits a laser beam or not, so as to control whether to cast light from the light-emitting section 3 toward the object. That is, on the basis of the identification signal, the emission control section 4 controls whether each of the plurality of laser elements 2 emits a laser beam or not, so as to change an area or a position of each of irradiation regions formed on the light-emitting section 3 by the laser beam (S4).

For example, in the case of (a) of FIG. 11, the emission control section 4 controls the plurality of laser elements 2 so that (i) one(s) of the plurality of laser elements 2 does not emit a laser beam, which one(s) of the plurality of laser elements 2 is arranged in a position corresponding to a position indicated by the coordinate values in the moving image, at which the oncoming car has been detected in the moving image, and (ii) the other ones of the plurality of laser elements 2 emit a laser beam. This makes it possible to cast light from the light-emitting section 3 toward, among a normal range of floodlighting L, a range of floodlighting a1 excluding a range of floodlighting a2 in which the object is included, as illustrated in (a) of FIG. 11. Accordingly, it is possible to reduce unpleasant brightness or dazzle given to a driver of an oncoming vehicle or a driver of a vehicle in front, for example. It is therefore possible to realize a safe and comfortable traffic environment.

Further, in the case of (b) of FIG. 11, the emission control section 4 controls the plurality of laser elements 2 so that one(s) of the plurality of laser elements 2 emits a laser beam, which one(s) of the plurality of laser elements 2 is arranged in a position corresponding to a position indicated by the coordinate values in the moving image, at which a deer (an accident factor) has been detected, and (ii) the other ones of the plurality of laser elements 2 do not emit a laser beam. Alternatively, the emission control section 4 (i) increases an output(s) of the one(s) of the plurality of laser elements 2, arranged in the position corresponding to the position indicated by the coordinate values of the accident factor, to be higher than those of the other ones of the plurality of laser elements 2, or (ii) decreases outputs of the other ones of the plurality of laser elements 2 to be lower than that of the one(s) of the plurality of laser elements 2, arranged in the position corresponding to the position indicated by the coordinate values of the accident factor. This makes it possible to cause, in the normal range of floodlighting L (the range of floodlighting a1), a range of floodlighting a3, in which the deer is included, to be brighter than the other range of the normal range of floodlighting L. That is, it becomes possible to illuminate, with brighter light, the deer which is an accident factor.

In this way, in the headlamp 100, the emission control section 4 controls whether each of the plurality of laser elements 2 emits a laser beam or not, so that cast light (i) includes an object (e.g., a road sign, a pedestrian, an animal, an obstacle, etc.) detected by the object detection section 13 or (ii) does not include an object (e.g., an oncoming vehicle, a vehicle in front, etc.) detected by the object detection section 13.

With the arrangement, in a case where the object detected by the object detection section 13 is a road sign, a pedestrian, or an animal, for example, such an object can be illuminated with brighter light. That is, it becomes possible for a driver to read a road sign or identify a pedestrian or an obstacle, by viewing such an object with bright light. Accordingly, it is possible to realize a safe driving environment.

Meanwhile, in a case where the object detected by the object detection section 13 is a vehicle or the like, floodlighting can be controlled so that such an object is not included in the range of floodlighting a1. It is therefore possible to prevent a driver of an oncoming vehicle or the like from being given unpleasant glare, for example.

That is, the identification of the kind of an object, carried out by the object identification section 14, makes it possible to (i) control optimally whether each of the plurality of laser elements 2 emits a laser beam or not in accordance with the kind of the object and therefore (ii) adjust the range of floodlighting a1 in accordance with the kind of the object.

Specific Operational Example 2

Each of (a) and (b) of FIG. 12 illustrates an operational example of how a light distribution pattern of a vehicle is adjusted in accordance with traffic regulations of a nation in which the vehicle is driven. (a) of FIG. 12 is a view illustrating a light distribution pattern of the headlamp 100 of a vehicle, in a case where the vehicle is driven in a nation where a driver is required by law to drive on the right side. (b) of FIG. 12 is a view illustrating a light distribution pattern of the headlamp 100 of a vehicle, in a case where the vehicle is driven in a nation where a driver is required by law to drive on the left side.

For example, in a case where a driver drives a vehicle in France where a driver is required by law to drive on the right side, it is necessary to adjust a light distribution pattern in accordance with a pattern for the driving on the right side. On the other hand, in a case where a driver drives in England where a driver is required by law to drive on the left side, it is necessary to adjust the light distribution pattern in accordance with a pattern for the driving on the left side. The emission control section 4 changes a position of each of irradiation regions of a laser beam on the light-emitting section 3 so as to satisfy the light distribution pattern of illumination light, ruled in the nation where a driver is required by law to drive on the right side, or the light distribution pattern of illumination light, ruled in the nation where a driver is required by law to drive on the left side.

Specifically, in a case where a driver comes and goes with his/her vehicle between England and France, for example, whether each of the plurality of laser elements 2 emits a laser beam or not is controlled in conjunction with the GPS so as to form the range of floodlighting a1 which is in conformity with a corresponding nation's law. In this way, the headlamp 100 of the present invention can be applied to a vehicle used in any nation in the world, and can be used on the vehicle.

Specific Operational Example 3

Further, the emission control section 4 controls, in accordance with driver's selection of a headlight for driving or a headlight for passing each other, whether each of the plurality of laser elements 2 emits a laser beam or not, so that the light distribution range is (i) in a range satisfying a light distribution property standard of a headlight for driving, ruled under a corresponding nation's law, or (ii) in a range satisfying a light distribution property standard of a headlight for passing each other, ruled under a corresponding nation's law. This makes it possible to form the range of floodlighting a1 in accordance with such a light distribution property standard.

The following description deals with how a range of floodlighting satisfying a light distribution property standard of a headlight for passing each other is formed, with reference to FIG. 13. (a) of FIG. 13 is a view illustrating an example of a range of floodlighting formed by light emitted from the headlamp 100. (b) of FIG. 13 is a view illustrating an example of an irradiation region formed on the light-emitting section 3 in a case where the range of floodlighting illustrated in (a) of FIG. 13 is formed.

Unlike the headlight for driving, the headlight for passing each other requires significantly-delicate light distribution control, so as to realize the light distribution property of the headlight for passing each other. Since the headlamp 100 has an arrangement in which the plurality of laser elements 2 are arranged in a matrix manner (see FIGS. 1 and 2, for example), the emission control section 4 can realize the light distribution property of the headlight for passing each other by controlling whether each of the plurality of laser elements 2 emits a laser beam or not.

(a) of FIG. 13 illustrates a case where the emission control section 4 carries out the aforementioned control and therefore a range of floodlighting a4 is formed. That is, the emission control section 4 controls the plurality of laser elements 2 so that light is not cast toward a range a5 in a range of floodlighting having the largest area (the range of floodlighting a1 in FIG. 3), which range of floodlighting is formed in a case where all the plurality of laser elements 2 emit a laser beam. With the control, it is possible to prevent illumination light from being emitted toward, particularly, an oncoming lane (see (a) of FIG. 13).

In this case, an irradiation region A2 corresponding to the range of floodlighting a4 and a non-irradiation region Al corresponding to the range a5 are formed in accordance with the control of whether each of the plurality of laser elements 2 emits light or not (see (b) of FIG. 13).

Here, segments on a light-receiving surface of the light-emitting section 3 illustrated in (b) of FIG. 13 correspond to respective irradiation regions formed by a laser beam emitted from the plurality of laser elements 2. In (b) of FIG. 13, a segment in the vicinity of the center of the light-emitting section 3 is smaller in size than a segment which is not in the vicinity of the center of the light-emitting section 3. That is, the plurality of laser elements 2 are arranged so that laser elements 2 corresponding to segments provided in the vicinity of the center of the light-emitting section 3 are densely provided.

With the arrangement, the headlamp 100 can realize, in the vicinity of the center of the headlamp 100, formation of a range of floodlighting which is more similar to the light distribution property of the headlight for passing each other, for which significantly-delicate light distribution control is required.

Specific Operational Example 4

Next, the following description deals with, with reference to FIGS. 14 through 16, a case where, in accordance with a tilt angle of a vehicle detected by the tilt detection section 15, the emission control section 4 controls whether each of the plurality of laser elements 2 emits a laser beam or not, so as to change an irradiation region. FIG. 14 is a view showing a flow of a process carried out by the headlamp 100 of the present operational example. Each of (a) through (c) of FIG. 15 illustrates an example of a relationship between a tilt angle of a vehicle and change of an irradiation region. FIG. 16 is a view schematically illustrating how illumination light emitted from a vehicle has an influence on an oncoming vehicle at a start of an uphill slope.

Generally, in a case where a vehicle 110 passes an oncoming vehicle 111 at a start of an uphill slope, the vehicle 110 gives a driver of the oncoming vehicle 111, for example, unpleasant glare of illumination light 110L emitted from the vehicle 110, as illustrated in FIG. 16. Further, in a conventional vehicle, changing a range of floodlighting of illumination light in accordance with tilt of the conventional vehicle requires moving a reflector itself of a headlamp of the conventional vehicle. Such movement requires a large moving mechanism, and a speed of moving the reflector is slow. Accordingly, in a case where such a moving mechanism is employed to change a range of floodlighting in a vertical direction (longitudinal direction), (i) there is a high risk that a driver of an oncoming vehicle might be given unpleasant glare, and therefore (ii) it is difficult to secure traffic safety. For the reasons described above, the moving mechanism is mainly used to change a range of floodlighting in a horizontal direction (right-and-left direction), in which a slow moving speed of the mechanism does not causes a big problem.

Meanwhile, the emission control section 4 of the headlamp 100 controls, in accordance with a result of detection by the tilt detection section 15 (tilt of the vehicle with respect to a horizontal plane), whether each of the plurality of laser elements 2 emits a laser beam or not, so as to change a position of the irradiation region. This makes it possible to (i) adjust the position of the range of floodlighting a1 in accordance with the tilt of the vehicle with respect to the horizontal plane, and, as a result, (ii) reduce unpleasant glare given to a driver of an oncoming vehicle etc. Further, a moving mechanism for changing the position of the range of floodlighting a1 can be downsized as compared with the moving mechanism for moving a conventional reflector. This makes it possible to change the position of the range of floodlighting a1 in the vertical direction quickly. That is, the headlamp 100 can be suitably employed to reduce unpleasant glare or dazzle given to a driver of an oncoming vehicle etc.

Specifically, as shown in FIG. 14, the tilt detection section 15 detects tilt of a vehicle, and finds a tilt angle of the vehicle in an anterior-posterior direction (S11). Then, the tilt detection section 15 supplies, to the emission control section 4, an angle signal indicating the tilt angle. In accordance with the angle signal, the emission control section 4 controls whether each of the plurality of laser elements 2 emits a laser beam or not. That is, the emission control section 4 controls, on the basis of the angle signal, whether each of the plurality of laser elements 2 emits a laser beam or not, so as to change an area or a position of the irradiation region formed on the light-emitting section 3 by the laser beam (S12).

For example, (a) of FIG. 15 illustrates a case where the vehicle 110 is driven on a flat road. In this case, the emission control section 4 drives all the plurality of laser elements 2, so as to irradiate the entire light-emitting section 3 with the laser beam. Here, the vehicle forms, for example, the range of floodlighting a1 in a range from an angle $-\alpha$ to an angle $+\alpha$ with respect to a front direction of the headlamp 100. Note here that (a) of FIG. 15 illustrates a case where each of twelve laser elements 2 emits a laser beam to the light-receiving surface of the light-emitting section 3 so that 4×3 irradiation regions are formed on the light-receiving surface in a matrix manner.

As compared with (a) of FIG. 15, (b) of FIG. 15 illustrates a case where the vehicle starts going up the uphill slope which is tilted at an angle of θ1 with respect to the horizontal plane, for example. Here, the emission control section 4 controls, for example, whether each of the plurality of laser elements 2 emits a laser beam or not so that no irradiation region is formed on a vertically-upper stage C1 of the light-emitting section 3. As a result, the headlamp 100 forms the range of floodlighting a1 in a range from an angle −α to an angle β (β<α) with respect to the front direction of the headlamp 100.

Further, as illustrated in (c) of FIG. 15, in a case where the vehicle goes up the uphill slope which is tilted at an angle of θ2 (>θ1) with respect to the horizontal plane, the emission control section 4 controls whether each of the plurality of laser elements 2 emits a laser beam or not so that no irradiation region is formed on a vertically-upper stage C2 of the light-emitting section 3. As a result, the headlamp 100 forms the range of floodlighting a1 in a range from an angle of −α to an angle of γ (γ<β) with respect to the front direction of the headlamp 100.

In this way, with the control carried out by the emission control section 4, the headlamp 100 can change, in accordance with the tilt of the road, the range of floodlighting also as not to give an influence on a driver of an oncoming vehicle etc. It is therefore possible to reduce unpleasant glare or dazzle given to a driver of an oncoming vehicle etc.

Further, in the above description, Operational Example 4 deals with a case where a vehicle goes up an uphill slope, as an example. Note, however, that in a case where the vehicle goes down a downhill slope, control similar to the control for the uphill slope can be carried out. With such control, it is possible to reduce unpleasant glare or dazzle given to a driver of an oncoming vehicle when the vehicle goes down a downhill slope.

Note that, the headlamp 100 can find out whether the vehicle goes up a slope or goes down a slope in such a manner that the object identification section 14 analyzes a moving image obtained with the use of the camera 16. In this case, the headlamp 100 does not necessarily include the tilt detection section 15.

Modification examples of the headlamp 100, i.e., a headlamp 200, a headlamp 300, a headlamp 400, and headlamp 500, are described below.

Modification Example 1

Next, the headlamp 200 (a light-emitting device, a vehicle headlight) which is a modification example of the headlamp 100 is described below with reference to FIG. 17. FIG. 17 is a schematic view illustrating an example of the headlamp 200. Unlike the headlamp 100, the headlamp 200 includes an elliptic mirror 20 (light-casting section) and a convex lens 11, in place of a parabolic mirror 5 (see FIG. 17). The following description deals with the elliptic mirror 20 and the convex lens 11 which are included in the headlamp 200.

(Elliptic Mirror 20)

The elliptic mirror 20 controls light emitted from the light-emitting section 3 by reflecting the light, in the same manner as the parabolic mirror 5. Further, the elliptic mirror 20 casts light toward a light distribution area (a light-castable range) which is a range in which the headlamp 200 (which includes the elliptic mirror 20) is capable of casting light. That is, the range of floodlighting a1 (see FIG. 3) is formed by illumination light emitted from the light-emitting section 3 in response to laser beams emitted from the plurality of laser elements 2.

Further, the elliptic mirror 20 casts the illumination light emitted from the light-emitting section 3.

According to the present modification example, the elliptic mirror 20 is obtained by coating FRP serving as a substrate with (i) Al serving as a reflective film and further with (ii) silicon oxide thereon, serving as an antioxidant for the Al coat.

Note, however, that the elliptic mirror 20 is not limited to this structure, as long as the elliptic mirror 20 has a function of reflection control. For example, the substrate of the elliptic mirror 20 can be made from another resin, such as acryl or polycarbonate, or can be a metallic member made from, for example, Al. The reflective film of the elliptic mirror 20 can be made from Ag or Pt. Further, the oxidation resistant film of the elliptic mirror 20 can be made from aluminum oxide, or can be a film which (i) employs a silicon oxide film and a titanium oxide film as a multilayer film and (ii) has an enhanced reflection function.

The elliptic mirror 20 of the present embodiment has an arrangement in which (i) an inner surface of the elliptic mirror made from a resin is coated with aluminum, (ii) an opening is of 38 mm in diameter, and (iii) a distance between a first focal point and a second focal point is 32.5 mm.

At least a part of the reflecting surface of the elliptic mirror 20 has an elliptical shape, and the elliptic mirror 20 has the first focal point on a laser beam incident side. Moreover, the elliptic mirror 20 has the opening in a direction in which the light emitted from the light-emitting section 3 is distributed, and has the second focal point on an opening side.

Light emitted from the light-emitting section 3, which is positioned at substantially the first focal point of the elliptic mirror 20, is reflected by the elliptic mirror 20 to be converged in the vicinity of the second focal point.

(Convex Lens 11)

The convex lens 11 causes light, which has been emitted from the light-emitting section 3 and has passed through a wavelength cut coating 10, to be substantially collimated light. Then, the convex lens 11 casts the substantially collimated light in front of the headlamp 200. This makes it possible to cast efficiently, within a solid angle, light emitted from the light-emitting section 3, so as to form the range of floodlighting a1. As a result, it is possible to have an improvement in use efficiency of the light.

Moreover, a position of the second focal point of the elliptic mirror 20 and a position of a focal point of the convex lens 11 are substantially identical with each other.

The convex lens 11 is supported by the wavelength cut coating 10 or the elliptic mirror 20 by being attached thereto. A surface of the convex lens 11, which surface is in contact with the wavelength cut coating 10 or the elliptic mirror 20, is substantially identical in size with the wavelength cut coating 10 (that is, the opening of the elliptic mirror 20). Further, a line, which passes through a principal point of the convex lens 11 and is orthogonal to a main plane of the convex lens 11, extends on a plane which extends through the first focal point and the second focal point of the elliptic mirror 20.

Modification Example 2

Next, the headlamp 300 (a light-emitting device, a vehicle headlight), which is another modification example of the headlamp 100, is described below with reference to FIG. 18. FIG. 18 is a schematic view illustrating an example of the headlamp 300. Unlike the headlamp 100, the headlamp 300 includes collimating lenses 30 (optical control sections) in place of initial mirrors 6 (see FIG. 18). The following description deals with the collimating lenses 30 included in the headlamp 300.

(Collimating Lens 30)

The collimating lenses 30 are provided between the plurality of laser elements 2 and the light-emitting section 3, and control guide of laser beams emitted from the plurality of laser elements 2 toward the light-emitting section 3. The collimating lenses 30 are arranged to face respective light-emitting points of the plurality of laser elements 2, that is, the collimating lenses 30 and the plurality of laser elements 2 correspond to each other, respectively. The laser beams transmitted by the collimating lenses 30 pass through a window section of the elliptic mirror 20 and reach the light-emitting section 3.

Here, in a case where the initial mirrors 6 are used as the light control sections, a travelling direction of the laser beam toward the initial mirrors 6 and a travelling direction of the laser beam which has been reflected by the initial mirrors 6 are different from each other. That is, the initial mirror 6 can change the travelling direction of the laser beam to be different from a direction of an optical axis of a light-emitting point of the laser element 2.

Accordingly, with the use of the initial mirrors 6, it is possible to arrange the plurality of laser elements 2 so that the light-emitting points of the plurality of laser elements 2 face in a direction (for example, a vertically-upward direction) which is different from a direction toward the opening of the elliptic mirror 20, as illustrated in FIG. 17 for example. Accordingly, in the case of FIG. 17, (i) the heat radiating base 7 is provided so that a surface of the heat radiating base 7 faces in the vertically-upward direction and (ii) the plurality of laser elements 2 are provided on the surface of the heat radiating base 7.

On the other hand, unlike the arrangement employing the initial mirrors 6, a direction of an optical axis of the light-emitting point of the laser element 2 and a travelling direction of the laser beam which has passed through the collimating lens 30 are substantially identical with each other.

For this reason, with the use of the collimating lenses 30, it is necessary to arrange the plurality of laser elements 2 so that a direction in which the light-emitting point of each of the plurality of laser elements 2 faces is substantially identical with a direction toward the opening of the elliptic mirror 20, as illustrated in FIG. 18 for example. Accordingly, in the case of FIG. 18, (i) the heat radiating base 7 is provided so that a surface of the heat radiating base 7 faces in a direction which is substantially identical with the direction toward the opening, and (ii) the plurality of laser elements 2 are provided on the surface.

For this reason, in order to reduce thermal resistance of each of the plurality of laser elements 2 with respect to the heat radiating base 7, parts of the surface of the heat radiating base 7 which parts face the plurality of laser elements 2, respectively, are required to have different angles with respect to the vertically-upward direction. Accordingly, from the viewpoint of versatility of the heat radiating base 7, the headlamp 200 employing the initial mirrors 6 is more preferable than the headlamp 300 employing the collimating lenses 30, because, with the initial mirrors 6, it is unnecessary to treat the surface of the heat radiating base 7 on which surface the plurality of laser elements 2 are provided.

Examples of the method for reducing thermal resistance of each of the plurality of laser elements 2 with respect to the heat radiating base 7 include (i) a method in which parts of the heat radiating base 7 are caused to have different angles, respectively, in accordance with respective optical paths of the plurality of laser elements 2, and (ii) a method in which the heat radiating base 7 is entirely curved.

Further, in the arrangement employing the collimating lenses 30 instead of the initial mirrors 6, it is impossible to carry out beam compression. For this reason, that arrangement requires a larger window of the elliptic mirror 20 than the arrangement employing the initial mirrors 6. Accordingly, from the viewpoint of floodlighting efficiency of the elliptic mirror 20, the headlamp 200 is more preferable than the headlamp 300.

The collimating lenses 30 can be convex lenses.

Modification Example 3

Next, the headlamp 400 (a light-emitting device, a vehicle headlight), which is another modification example of the headlamp 100, is described below with reference to FIGS. 19 through 21. FIG. 19 is a schematic view illustrating an example of the headlamp 400. FIG. 20 is a schematic view illustrating examples of a configuration in the vicinity of a laser element array 40. FIG. 21 is a view illustrating other examples of the configuration in the vicinity of the laser element array 40. Unlike the headlamp 100, the headlamp 400 includes (i) the laser element array 40 in which the plurality of laser elements 2 are arranged in an array, (ii) an initial mirror 44 (light control sections, mirrors) in which a plurality of initial mirrors 6 are arranged in an array, (iii) a stem 43 (a seat, a housing), and (iv) a cap 45 (a housing) (see FIG. 19).

Note that the laser element array 40 has a basic structure which is a laser beam source group including a plurality of laser beam sources, each of which is made up of a laser chip 41 and a sub-mount 42.

Further, the stem 43 and the cap 45 constitute a single housing in which the laser element array 40 and the initial mirror 44 are provided. This structure allows reducing thermal resistance between the laser chip 41 and the stem 43.

Accordingly, in a case where the same heat radiating base 7 and the same fin 8 as those of the headlamp 100 are employed in the headlamp 400, it is possible for the headlamp 400 to have an increase in system reliability, as compared with the headlamp 100. From another point of view, in a case where the same system reliability as that of the headlamp 100 is set to the headlamp 400, it is possible to downsize the headlamp 400 entirely, as compared with the headlamp 100. That is, it is possible to have a reduction in size of the light-emitting device 1 (headlamp 400).

Moreover, it is easy to control positioning of the laser chips 41 and the initial mirror 44 relative to each other. This allows an increase in production yield of the headlamp 400.

Further, with the headlamp 400, it is possible to downsize the window of the elliptic mirror 20, as compared with the headlamp 300.

(Laser Element Array 40)

The laser element array 40 is in contact with a single stem 43 attached to the heat radiating base 7, and is made up of a plurality of laser chips 41 and a plurality of sub-mounts 42. As illustrated in (c) of FIG. 20, the plurality of laser chips 41 are arranged on the plurality of sub-mounts 42, respectively.

Each of the plurality of laser chips 41 has a function similar to that of a chip included in each of the plurality of laser elements 2. Each of the plurality of sub-mounts 42 serves as a die-bonding section for a corresponding one of the plurality of laser chips 41. For example, as illustrated in (a) and (b) of FIG. 20, the plurality of laser chips 41 and the plurality of sub-mounts 42 are arrayed so as to form the laser element array 40. That is, by employing such a laser element array 40 as a laser beam source group, it becomes possible to downsize the light-emitting device 1. Details of arrangements illustrated in (a) and (b) of FIG. 20 are described below more specifically.

(Stem 43)

The stem 43, which is thermally conductive, has (i) a surface (a second plane, an outer part of the stem 43, having a largest area) which faces the heat radiating base 7 and (ii) a surface (a first plane, a surface most of which is sealed with the cap 45) which is substantially parallel to the second plane (see FIG. 20).

The laser element array 40 and the initial mirror 44 are in contact with the first plane of the stem 43. With the arrangement, heat generated by the laser element array 40 is directly guided from the first plane to the second plane, so that the heat is not retained in the stem 43 but guided to the fins 8 via the heat radiating base 7. Consequently, it is possible to cool the laser element array 40 efficiently. Further, since the laser element array 40 is in contact with the first plane, it is possible to downsize the light-emitting device 1 as compared with a case where the laser element array 40 is provided in a position other than a position on the first plane of the stem 43.

In the above description, the present modification example deals with a case where the stem 43 and the light-emitting section 3 are arranged so that the center of the first plane of the stem 43 substantially faces the light-emitting section 3, as illustrated in FIG. 19. Note, however, that it is possible to arrange, like the headlamp 100, the heat radiating base 7 in a lateral direction in FIG. 19 (so that the surface of the heat radiating base 7 faces in the vertically-upward direction) by providing a mirror between the light-emitting section 3 and the laser element array 40. In this case, it is possible to cause the stem 43 and a light-emitting section supporter 9 to share the heat radiating base 7.

(Initial Mirror 44)

The initial mirror 44 has the same function as that of the initial mirror 6, and is provided to face the laser element array 40. The initial mirror 44 is provided at substantially the center of the first plane of the stem 43. With the arrangement, a laser beam emitted from each of the plurality of laser chips 41 of the laser element array 40 reaches the initial mirror 44 appropriately, so that the initial mirror 44 guides the laser beam toward the light-emitting section 3 by reflecting the laser beam. Further, with the arrangement, it is possible to efficiently radiate heat generated due to reflection loss of the laser beam at the initial mirror 44, which reflection loss is caused in such a manner that the initial mirror 44 does not reflect the laser beam but absorbs the laser beam, for example.

Further, it is preferable that the initial mirror 44 is attached to the first plane of the stem 43 and then the plurality of laser chips 41 are attached to the plurality of sub-mounts 42, respectively. In this case, it is possible to adjust easily an installation position of the laser element array 40 in consideration of (i) control of guide of the laser beam, (ii) a light-emitting shape of the light-emitting section 3, (iii) a position of a light-emitting point of the light-emitting section 3 etc. It becomes therefore possible to manufacture the light-emitting device 1 more easily.

Furthermore, it is possible to employ either an arrangement in which one (1) initial mirror 44 is provided to face one (1) laser element array 40, or another arrangement in which a plurality of initial mirrors 44 are provided to face the plurality of laser chips 41 of the laser element array 40, respectively.

In a case where the initial mirror 44 is constituted by a plurality of initial mirrors, the initial mirror 44 preferably is an array mirror. Such an array mirror is obtained by forming, in accordance with the light-emitting shape of the light-emitting section 3, plural kinds of initial mirrors with differently curved reflective surfaces at once. For this reason, with the use of such an array mirror, it is possible to simplify a manufacturing process. Further, since the initial mirror 44 being an array mirror is provided for each of the plurality of laser chips 41, it is possible to guide the laser beam emitted from each of the plurality of laser chips 41 to the light-emitting section 3 accurately.

(Cap 45)

The cap 45 seals the first plane of the stem 43 so as to protect the laser element array 40 and the initial mirror 44, as illustrated in FIG. 20. An inner space sealed with the cap 45 is filled with dry air. A sealing method may be a resistance welding method, but other methods can be also used for the sealing.

With the cap 45, it is possible to prevent the laser beam from collecting dust, and also prevent dust or dirt from falling on the laser element array 40 and the initial mirror 44. A part (at least a part on the optical path formed by the laser beam) of the cap 45 is made of a transparent plate (e.g., kovar glass), and transmits the laser beam which has been reflected by the initial mirror 44.

(Variation of Laser Element Array 40)

Next, a variation of the laser element array 40 is described below with reference to (a) and (b) of FIG. 20. Note that, each of laser element arrays 40*a* and 40*b* has the same function as that of the laser element array 40, and each of initial mirrors 44*a* and 44*b* has the same function as that of the initial mirror 44. Each of sub-mount groups 42*a* and 42*b* is constituted by a plurality of sub-mounts 42.

In the case of (a) of FIG. 20, two initial mirrors 44*a* are provided at substantially the center of the stem 43, and two laser element arrays 40*a* (a first laser beam source group and a second laser beam source group) are provided to face the respective two initial mirrors 44*a*.

Each of the laser element arrays 40*a* and each of the sub-mount groups 42*a* have a rectangular shape as viewed from the first plane of the stem 43. In this case, even if a plurality of laser beam sources, each being constituted by a laser chip 41 and a sub-mount 42, are provided, the plurality of laser beam sources can be provided in block as a laser beam source group, that is, it is possible to have a reduction in area of a region where the plurality of laser beam sources are provided. Further, each of the two initial mirrors 44*a* is an array mirror.

(a) of FIG. 20 deals with a case where two laser element arrays 40*a* are provided. Note, however, that the present embodiment is not limited to this, and it is possible to provide three or more laser element arrays 40*a*. For example, it is possible to divide one of the two laser element arrays 40*a* illustrated in (a) of FIG. 20 into two laser element arrays.

Further, in the case of (b) of FIG. 20, a single laser element array 40*b* is provided to face an initial mirror 44*b* which is provided at substantially the center of the stem 43. The laser element array 40*b* and a sub-mount group 42*b* each have a circular shape as viewed from the first plane of the stem 43. That is, the laser element array 40*b* is provided to surround the initial mirror 44*b*. In this case, it is possible to have a reduction in size of the light-emitting device 1 as compared with a case where the laser element array 40*b* is formed to have a rectangular shape (as illustrated in (a) of FIG. 20).

Other variations of the laser element array 40 are described below with reference to FIG. 21. Each of arrangements illustrated in (a) and (b) of FIG. 21 is different from the arrangements illustrated in (a) and (b) of FIG. 20 in that there is provided a stem 243 having a convex section 243*a* and the convex section 243*a* is provided with the laser element arrays 40*a*. That is, in each of the arrangements illustrated in (a) and (b) of FIG. 21, the laser element arrays 40*a* are provided not on the first plane of the stem 43 but on a side surface of the convex section 243*a* (a plane perpendicular to the first plane and the second plane) so that the light-emitting point of the laser chip 41 faces toward the light-emitting section 3.

In this case, the heat generated by the laser element arrays 40*a* is retained at the convex section 243*a*, as compared with the arrangements illustrated in (a) and (b) of FIG. 20. Accordingly, in consideration of heat radiating efficiency, the arrangements illustrated in (a) and (b) of FIG. 20 are more preferable than the arrangements illustrated in (a) and (b) of FIG. 21.

Further, the arrangement illustrated in (b) of FIG. 21 is different from the arrangement illustrated in (a) of FIG. 21 in that a cap 245 including collimating lenses 30 is provided so that the collimating lenses 30 face the laser element arrays 40a, respectively. With the arrangement illustrated in (b) of FIG. 21, it is unnecessary to provide the collimating lenses 30 separately. Accordingly, with the arrangement illustrated in (b) of FIG. 21, it is possible to have a reduction in size of the light-emitting device 1, as compared with the arrangement illustrated in (a) of FIG. 21.

Note, however, that, with the arrangements illustrated in (a) and (b) of FIG. 21, it is necessary to have a reduction in size of the convex section 243a so as to have a reduction in distance between beams (a distance between the laser element arrays 40a). This increases the thermal resistance of the laser element arrays 40a with respect to the heat radiating base 7. That is, a reduction in distance between the beams and a reduction in thermal resistance conflicts each other. For this reason, it is preferable to employ the arrangements illustrated in (a) and (b) of FIG. 20.

Modification Example 4

Next, the headlamp 500 (a light-emitting device, a vehicle headlight), which is another modification example of the headlamp 100, is described below with reference to FIG. 22. FIG. 22 is a schematic view illustrating an example of the headlamp 500. Unlike the headlamp 100, the headlamp 500 includes a bundle fiber 50 (a light control section, a light guide section, an optical fiber) in place of the initial mirror 6 (see FIG. 22).

(Bundle Fiber 50)

The bundle fiber 50 is a bundle of a plurality of optical fibers. The bundle fiber 50 controls the laser beam emitted from each of the plurality of laser elements 2 to travel toward the light-emitting section 3. The bundle fiber 50 includes incident end sections 50a for receiving laser beams emitted from the plurality of laser elements 2, and emission end sections 50b for emitting the laser beams to the light-emitting section 3. With the use of the bundle fiber 50, it is necessary to only provide the plurality of laser elements 2 on an incident end section 50a side. Accordingly, it is possible to arrange the plurality of laser elements 2 in consideration of convenience in controlling or replacing the plurality of laser elements 2. Such an arrangement can be realized since the bundle fiber 50 has flexibility.

The incident end sections 50a of the bundle fiber 50 are connected to the plurality of laser elements 2 via butt joints (not illustrated).

Further, the emission end sections 50b are located in the vicinity of the window of the elliptic mirror 20, and emit the laser beams toward the light-emitting section 3 from outside the elliptic mirror 20. In this case, it is possible to have an increase in reflection efficiency of the light emitted from the light-emitting section 3. Note that, the present embodiment is not limited to this, and the emission end sections 50b can be provided inside the elliptic mirror 20. In this case, it is possible to have an increase in accuracy in irradiating the light-emitting section 3 with the laser beams.

Moreover, the emission end sections 50b of the bundle fiber 50 are preferably arranged so as to be capable of forming the irradiation regions illustrated in FIG. 6 (a). In this case, it is preferable to arrange the emission end sections 50b in accordance with the aforementioned arrangement of the plurality of laser elements 2. That is, at least two of the plurality of emission end sections 50b are provided so that, among the irradiation regions formed on the light-emitting section 3 by the laser beams emitted from the respective plurality of laser elements 2, irradiation regions corresponding to the at least two of the emission end sections 5 are provided in different positions, respectively. In other words, the plurality of laser elements 2 emit laser beams so that, among the irradiation regions formed on the light-emitting section 3 by the laser beams emitted from the respective plurality of laser elements 2, at least two of the irradiation regions are formed in different positions, respectively.

Further, according to the present modification example, the incident end section 50a and the emission end section 50b of the bundle fiber 50 each have a numerical aperture (NA) of 0.18.

Note, however, that it is possible to adjust an NA of the light-emitting section 3 and an NA of the incident end section 50a, so as to have a reduction in excitation area of the light source section (laser element 2) while maintaining coupling efficiency of the laser beam. In this case, the adjustment is carried out so that the NA of the light-emitting section 3 is greater than the NA of the incident end section 50a.

The plurality of laser elements 2 and the bundle fiber 50 are not necessarily connected to each other via the butt joints, and can be optically connected to each other by use of lenses or mirrors. Further, the light-emitting section 3 and the bundle fiber 50 may be optically connected to each other by providing lenses or mirrors therebetween.

Further, it is preferable that a core of each of the plurality of optical fibers constituting the bundle fiber 50 has a polygonal cross section taken in a direction perpendicular to a direction in which the laser beam is guided. In this case, it is possible to arrange the plurality of optical fibers more densely as compared with a case where the core has a circular cross section. Accordingly, with such an arrangement, it becomes easy to irradiate a desired position on the light-emitting section 3 with a laser beam emitted from each of the plurality of laser elements 2.

The bundle fiber 50 of the present variation is constituted by a bundle of multimode fibers. Energy intensity distribution (light intensity distribution) of the laser beam emitted from each of the plurality of laser elements 2 is substantially identical with Gaussian distribution. However, with the use of the multimode fibers, it is possible to convert the energy intensity distribution of the laser beam into substantially top hat distribution (in which the energy intensity distribution is substantially uniform). Accordingly, it becomes possible to suppress deterioration of the light-emitting section 3 due to irradiation with the laser beam.

Other Arrangements

The light-emitting section 3 of each of the headlamps 100 through 500 described above is such that, on receipt of the laser beam emitted from each of the plurality of laser elements 2, the light-emitting section 3 emits fluorescence mainly toward a laser element 2 side. Such a light-emitting section is called "reflective light-emitting section" in the present specification.

The light-emitting section 3 of the present embodiment is not necessarily the "reflective light-emitting section". For example, it is possible to employ a light-emitting section in which (i) a light-receiving surface of the light-emitting section is irradiated with a laser beam emitted from each of the plurality of laser elements 2, and (ii) the light-emitting section emits fluorescence mainly toward a side opposite to the light-receiving surface. Such a light-emitting section is called "transmissive light-emitting section" in the present specification.

In an arrangement employing the "transmissive light-emitting section", the light-emitting section is provided on the light-emitting section supporter 9, for example, and a laser beam incident to the light-emitting section is converted into fluorescence, and then, the fluorescence is emitted mainly toward a side opposite to the laser element 2 side.

Various embodiments of the light-emitting device of the present embodiment and various embodiments of the vehicle headlight of the present embodiment are thus described. These various embodiments merely indicate examples, and the embodiments explained here can be combined with each other appropriately, as a matter of course.

[Difference from Conventional Arts]

Finally, a light-emitting device in accordance with the present embodiment including the foregoing various features can solve the following problems of the techniques of Patent Literature 1 etc.

The vehicle headlamp of Patent Literature 1 emits a laser beam directly to the outside, and includes no light-emitting section that emits light in response to the laser beam. Therefore, the vehicle headlamp of Patent Literature 1 has a problem of having an extremely low color rendering property of light having a wavelength other than a wavelength of the laser beam.

As in the case of the vehicle headlamp of Patent Literature 1, the headlight of Patent Literature 2 also includes no light-emitting section that emits light in response to the laser beam. Therefore, the headlight of Patent Literature 2 has a problem of having an extremely low color rendering property of light having a wavelength other than a wavelength of the laser beam.

The vehicle lamp of Patent Literature 3 uses an LED as a light source. Since an LED is lower in luminance than a laser beam source, it is necessary to increase a light-emitting area so as to obtain a necessary luminous flux. Accordingly, in a case where an LED light source is used in an automobile or a motorcycle which is limited in size of a lamp, there occurs a problem such that the LED light source irradiates a wider region than a laser beam source and it is therefore impossible to reduce a size of a lamp such as a running light that is required to cast light at a narrow angle.

Further, according to the vehicle lamp of Patent Literature 3, it is difficult in terms of a vehicle front space to set a lamp which is further required to cast light at a narrow angle than a running light, e.g., which illuminates only an object (e.g., a human) existing at a place to be irradiated (e.g., 40 meters ahead) or does not illuminate only an object (e.g., an opposite lane). It is also difficult to freely change a light distribution pattern by combining a plurality of narrow-angle light-casting devices.

In addition, according to the vehicle lamp of Patent Literature 3, there exists a non-light-emitting part between respective LEDs. Therefore, the vehicle lamp needs to be used while being blurred at an irradiated position. This makes it impossible to obtain a contrast (which clarifies a boundary between a bright part and a dark part). Note that, in a case where the vehicle lamp is used without being blurred at an irradiated position, a higher contrast is obtained but a non-light-emitting part between respective LEDs is projected. Therefore, for example, in a case where two LEDs turn on, bright-dark-bright floodlighting occurs.

The light source device of Patent Literature 4 is a device which merely emits light, i.e., a device which merely illuminates. Patent Literature 4 discloses, as light control means for changing an emission range and/or an intensity distribution of excitation light, a method for moving a solid light source and a method for moving a mirror.

However, in a case where the light source device of Patent Literature 4 uses a solid light source, even if the light source device uses a semiconductor laser having high directivity, a beam diffusion angle is as wide as 40°. Therefore, though it is possible to change an emission range and/or an intensity distribution of excitation light, it is impossible to excite only any place in a fluorescent body layer.

Further, the light source device of Patent Literature 4 is not arranged to control an irradiated position and an irradiation region (a spot size) in a fluorescent body part for each of beams of light emitted from a plurality of solid light sources. Accordingly, the light source device of Patent Literature 4 is incapable of uniformly irradiating an entire surface of a fluorescent body layer (cause the entire surface of the fluorescent body layer to uniformly emit light). In addition, for a similar reason, the light source device of Patent Literature 4 has a problem of being incapable of exciting the fluorescent body layer in a complicated shape (e.g., preventing a central part of the fluorescent body layer from emitting light and causing a circumference of the fluorescent body layer to emit light).

Patent Literature 4 also discloses (i) an arrangement in which fluorescence is cast by providing a fluorescent body layer at a focal point of a lens system and (ii) an arrangement in which a light-emitting component that is emitted in a front direction is increased by providing a reflection layer on a side surface of the fluorescent body layer. However, the light source device of Patent Literature 4 exhibits a characteristic of substantially Lambertian-shaped distribution of fluorescence. This prevents all fluorescence from entering an aperture of a lens, so that the light source device becomes an optical system which is extremely great in loss.

Moreover, according to the light source device of Patent Literature 4, it is necessary to increase NA (numerical aperture) (which is determined depending on a lens aperture and a lens focal distance) so as to use fluorescence with higher efficiency. However, according to the light source device of Patent Literature 4, a fluorescent body is excited by causing excitation light to pass between the fluorescent body layer and a lens. Therefore, in a case where a lens having large NA is used, excitation light is rejected by the lens since the excitation light is dispersed at a large angle. This prevents effective excitation of the fluorescent body layer. Contrary to this, it is necessary to reduce NA so that excitation light is effectively emitted. This prevents effective casting of fluorescence. Namely, the light source device of Patent Literature 4 is a system which is extremely low in efficiency.

Furthermore, according to the light source device of Patent Literature 4, in order to move the solid light source and to make the light source device to be smaller and lower in weight, the solid light source is not cooled while the fluorescent body layer is cooled. This makes it impossible to obtain a luminance necessary for narrow-angle floodlighting by a vehicle lamp.

Further, Patent Literature 4 discloses a method which uses a digital micromirror device (DMD). This method is excellent in that an excitation range of the fluorescent body layer is controlled (patterned). However, according to the method, the digital micromirror device is entirely illuminated, and only light emitted to a part of the digital micromirror device is used. This causes a problem such that energy as much as unused light is lost and thus the light source device of Patent Literature 4 is low in efficiency, i.e., consumes more electric power.

In addition, the light source device of Patent Literature 4 uses excitation light having a light intensity distribution such that an emission range and/or an intensity distribution of the excitation light is changed by moving an exciting light source. This causes a problem such that the DMD surface also has a light intensity distribution and it is therefore impossible to obtain a sufficient contrast at a place with a weak light intensity even by turning on/off a micromirror.

A light-emitting device and the like in accordance with the present embodiment have been made in view of the above problems, and a light-emitting device and a vehicle headlight each having a high color rendering property and being capable of realizing any light distribution pattern are provided.

Summary

A light-emitting device in accordance with one aspect of the present invention is a light-emitting device, including: a plurality of laser beam sources each for emitting a laser beam; a light-emitting section for emitting light in response to the laser beam emitted from at least one of the plurality of laser beam sources; and emission control means for controlling whether each of the plurality of laser beam sources emits light or not, at least a part of the plurality of laser beam sources being positioned in such a manner that irradiation regions of the light-emitting section which are respectively irradiated with the laser beams emitted from the plurality of laser beam sources are positioned at least partially differently.

With the arrangement, the plurality of laser beam sources are positioned in such a manner that the irradiation regions of the light-emitting section are positioned at least partially differently, and each of the plurality of laser beam sources is controlled whether to emit light or not, so that a light distribution pattern of illumination light can be changed freely.

In this case, a light-emitting device in accordance with one aspect of the present invention secures sufficient luminance by using laser beam sources. Furthermore, inclusion of the light-emitting section for emitting light in response to the laser beam enables the light-emitting device to have improved color rendering property and higher contrast of light whose wavelength is other than that of the laser beam.

That is, the light-emitting device in accordance with one aspect of the present invention has color rendering property that enables the light-emitting device to be used for a vehicle headlamp, and is capable of changing a light distribution pattern.

Furthermore, it is preferable to arrange the light-emitting device in accordance with one aspect of the present invention to further include at least one light control section for controlling guide of the laser beams emitted from the plurality of laser beam sources toward the light-emitting section.

With the arrangement, said at least light control section controls guide of the laser beams, so that the plurality of laser beam sources can be positioned freely with respect to the light-emitting section.

Furthermore, it is preferable to arrange the light-emitting device in accordance with one aspect of the present invention such that said at least one light control section is a mirror for controlling guide of the laser beams emitted from the plurality of laser beam sources by reflecting the laser beams emitted from the plurality of laser beam sources.

With the arrangement, said at least one light control section is a mirror, which allows reducing deterioration in a coat film compared to a case where all light control sections are lenses. This allows improving durability of the light control section.

Furthermore, it is preferable to arrange the light-emitting device in accordance with one aspect of the present invention such that said at least one light control section includes an enhanced reflection structure.

With the arrangement, said at least one light control section includes an enhanced reflection structure, which enables said at least one light control section to reduce loss of reflection of the laser beam. That is, it is possible to reduce mirror loss of said at least one light control section.

Furthermore, it is preferable to arrange the light-emitting device in accordance with one aspect of the present invention such that the plurality of laser beam sources and said at least one light control section are included in a single housing.

With the arrangement, the plurality of laser beam sources and said at least one light control section are included in a single housing, which enables the light-emitting device to be smaller in size. Furthermore, since the plurality of laser beam sources are included in a single housing, it is possible to prevent the laser beams (e.g. ultraviolet) emitted from the laser beam sources from collecting dusts.

Furthermore, it is preferable to arrange the light-emitting device in accordance with one aspect of the present invention such that the plurality of laser beam sources constitute at least a first laser beam source group and a second laser beam source group, and said at least one light control section includes a plurality of light control sections corresponding to the first laser beam source group and the second laser beam source group, respectively.

With arrangement, the plurality of laser beam sources constitute at least a first laser beam source group and a second laser beam source group, which enables the light-emitting device to have smaller regions where the laser beam sources are provided. This enables the light-emitting device to be smaller in size. Furthermore, since the plurality of light control sections are positioned in such a manner as to correspond to the first laser beam source group and the second laser beam source group, respectively, it is possible to suitably and easily radiate the light-emitting section with the laser beams emitted from the laser beam sources while downsizing the light-emitting device.

Furthermore, it is preferable to arrange the light-emitting device in accordance with one aspect of the present invention such that the plurality of laser beam sources are positioned around said at least one light control section.

With the arrangement, it is possible to downsize the light-emitting device compared to a case where a plurality of laser beam sources are positioned to be in line for example.

Furthermore it is preferable to arrange the light-emitting device in accordance with one aspect of the present invention such that said at least one light control section includes a plurality of light control sections, the plurality of light control sections constitute at least one array mirror, and the plurality of laser beam sources are positioned in such a manner as to face the plurality of light control sections, respectively.

With the arrangement, the plurality of light control sections are array mirrors. In this case, plural kinds of mirrors with different reflection curves can be made at once, which simplifies a production process. Furthermore since the laser beam sources are positioned in such a manner as to correspond to the light control sections, respectively, it is possible to accurately guide the laser beams emitted from the laser beam sources to the light-emitting section.

Furthermore, it is preferable to arrange the light-emitting device in accordance with one aspect of the present invention so as to further include: a seat which is thermally conductive; and a heat radiating section for radiating heat generated in the plurality of laser beam sources, the seat having a first plane to which the plurality of laser beam sources are attached and a second plane to which the heat radiating section is attached, the first plane being substantially parallel to the second plane.

For example, in a case where a seat has a convex section on a first plane and laser beam sources are attached to the convex section (i.e. the laser beam sources are attached to a portion other than the first plane), heat generated from the laser beam sources remain in the seat, making it impossible to efficiently cool down the laser beam sources.

With the arrangement, the laser beam sources and the heat radiating section are attached to the first plane and the second plane of the thermally conductive seat, respectively. This enables the heat generated from the laser beam sources to be directly transmitted from the first plane of the seat to the second plane thereof, so that the heat is transmitted to the heat radiating section without remaining in the seat. This allows efficiently cooling down the laser beam sources.

Furthermore, since the laser beam sources are attached to the first plane, it is possible to downsize the light-emitting device compared to a case where the laser beam sources are attached to a portion other than the first plane.

Furthermore, it is preferable to arrange the light-emitting device in accordance with one aspect of the present invention such that said at least one light control section is attached to the first plane of the seat.

With the arrangement, said at least one light control section is attached to the seat, so that heat generated due to loss of reflection of the laser beam by the light control section, such as absorption of the laser beam by the light control section without reflecting the laser beam, can be efficiently radiated.

Furthermore, in general, in a case where a laser beam source and a light control section are attached to the same object, the laser beam source is attached to the object after the light control section is attached to the object. This allows easily adjusting where the laser beam source is positioned in consideration of controlling guide of a laser beam and what shape the light-emitting section emits light in and where light-emitting points are positioned. This allows easy production of the light-emitting device. With the arrangement, since the laser beam sources and the light control section are attached to the first plane of the seat, it is possible to easily adjust where the laser beam source is positioned and to easily produce the light-emitting device.

Furthermore, it is preferable to arrange the light-emitting device in accordance with one aspect of the present invention such that said at least one light control section is at least one light guide section including an incident end section for receiving the laser beams emitted from the plurality of laser beam sources and an emission end section for emitting the laser beams to the light-emitting section.

With the arrangement, the light guide section receives a laser beam via the incident end section and emits the laser beam via the emission end section so as to guide the laser beam to the light-emitting section. This enables the laser beam sources to be provided closer to the incident end section. This enables the laser beam sources to be positioned in consideration of control of the laser beam sources, easiness in replacement of the laser beam sources etc.

Furthermore, it is preferable to arrange the light-emitting device in accordance with one aspect of the present invention such that said at least one light guide section includes a plurality of light guide sections, and the plurality of light guide sections each include a core having a polygonal cross section taken in a direction perpendicular to a direction in which the laser beams are guided.

With the arrangement, it is possible to position the plurality of light guide sections to be closer to each other compared to a case where the core has a round cross section. This allows easily emitting the laser beams to desired positions of the light-emitting section, respectively.

Furthermore, it is preferable to arrange the light-emitting device in accordance with one aspect of the present invention such that said at least one light guide section is a multimode fiber.

With the arrangement, since said at least one light guide section is a multimode fiber, it is possible to convert energy intensity distribution of the laser beam emitted from each of the laser beam sources, which distribution is substantially Gaussian distribution, into substantially top hat distribution. This enables the energy intensity distribution of each laser beam on the light-emitting section to be substantially constant, thereby preventing deterioration in the light-emitting section.

Furthermore, it is preferable to arrange the light-emitting device in accordance with one aspect of the present invention so as to further include detection means for detecting an object in a light-castable range which is a range in which the light-emitting device is capable of casting light, the emission control means controlling whether each of the plurality of laser beam sources emits light or not in accordance with a result of detection by the detection means.

With the arrangement, the emission control means controls whether the laser beam is emitted or not in accordance with the result of detection by the detection means, so that light is cast to the detected object. This allows controlling a light distribution pattern of light to be cast to the object. Consequently, it is possible to control the light distribution pattern in such a manner that, for example, the detected object is wholly or partially irradiated with light.

Furthermore, it is preferable to arrange the light-emitting device in accordance with one aspect of the present invention so as to further include identification means for identifying the kind of the object detected by the detection means, and the emission control means controls whether each of the plurality of laser beam sources emits light or not in accordance with the kind of the object identified by the identification means.

With the arrangement, the light-emitting device further includes the identification means for identifying, by image recognition, the kind of the object detected by the detection means. Therefore, by the emission control means controlling whether a laser beam is emitted or not in accordance with the kind of the object identified by the identification means, it is possible to control a light distribution pattern of light cast to the object. Consequently, it is possible to control the light distribution pattern in such a manner that, for example, the detected object is wholly or partially irradiated with light or the detected object is not irradiated with light.

Furthermore, it is preferable to arrange the light-emitting device in accordance with one aspect of the present invention so as to further include a light-casting section for casting the light emitted from the light-emitting section, the light-emitting section being smaller in size than the light-casting section.

With the arrangement, the light-emitting section is smaller in size than the light-casting section, so that light emitted from the light-emitting section can be efficiently cast in front of the light-casting section.

Furthermore, it is preferable that a vehicle headlamp in accordance with one aspect of the present invention includes the aforementioned light-emitting device.

With the arrangement, the vehicle headlamp in accordance with one aspect of the present invention can cast light to anywhere, so that a light distribution pattern can be changed freely.

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

The present invention relates to a light-emitting device which has high color rendering property and is capable of realizing any light distribution pattern. The present invention is applicable to a headlamp for a vehicle etc. in particular.

REFERENCE SIGNS LIST

1 Light-emitting device
2 Laser element
3 Light-emitting section
4 Emission control section (emission control means)
5 Parabolic mirror (light-casting section)
6 Initial mirror (light control section, mirror)
7 Heat radiating base (heat radiating section)
8 Fin (heat radiating section)
13 Object detection section (detection means)
14 Object identification section (identification means)
20 Elliptic mirror (light-casting section)
30 Collimating lens (light control section)
40a, 40b Laser element array (first laser beam source group, second laser beam source group)
41 Laser chip (laser beam source)
42 Sub-mount (laser beam source)
43 Stem (seat, housing)
44, 44a, 44b Initial mirror (light control section, mirror, array mirror)
45 Cap (housing)
50 Bundle fiber (light control section, light guide section, optical fiber)
50a Incident end section
50b Emission end section
100, 200, 300, 400, 500 Headlamp (light-emitting device, vehicle headlight)
243 Stem (seat, housing)
245 Cap (housing)
a1 Range of floodlighting
a3 Range of floodlighting
a4 Range of floodlighting

The invention claimed is:

1. A light-emitting device, comprising:
a plurality of laser beam sources each for emitting a laser beam;
a fluorescent unit for emitting light in response to the laser beam emitted from at least one of the plurality of laser beam sources;
an emission controller for controlling whether each of the plurality of laser beam sources emits light or not, at least a part of the plurality of laser beam sources being positioned in such a manner that irradiation regions of the fluorescent unit which are respectively irradiated with the laser beams emitted from the plurality of laser beam sources are positioned at least partially differently; and
at least one optical element for controlling guide of the laser beams emitted from the plurality of laser beam sources toward the fluorescent unit, said at least one optical element being a mirror for controlling guide of the laser beams emitted from the plurality of laser beam sources by reflecting the laser beams emitted from the plurality of laser beam sources.

2. The light-emitting device as set forth in claim 1, wherein said at least one optical element includes an enhanced reflection structure.

3. The light-emitting device as set forth in claim 1, wherein the plurality of laser beam sources and said at least one optical element are included in a single housing.

4. The light-emitting device as set forth in claim 3, wherein
the plurality of laser beam sources constitute at least a first laser beam source group and a second laser beam source group, and
said at least one optical element includes a plurality of optical elements corresponding to the first laser beam source group and the second laser beam source group, respectively.

5. The light-emitting device as set forth in claim 3, wherein the plurality of laser beam sources are positioned around said at least one optical element.

6. The light-emitting device as set forth in claim 3, wherein
said at least one optical element includes a plurality of optical elements,
the plurality of optical elements constitute at least one array mirror, and
the plurality of laser beam sources are positioned in such a manner as to face the plurality of optical elements, respectively.

7. The light-emitting device as set forth in claim 1, wherein said at least one optical element is at least one light guide including an incident end section for receiving the laser beams emitted from the plurality of laser beam sources and an emission end section for emitting the laser beams to the fluorescent unit.

8. The light-emitting device as set forth in claim 7, wherein said at least one light guide is a multimode fiber.

9. The light-emitting device as set forth in claim 1, further comprising a computing unit for detecting an object in a light-castable range which is a range in which the light-emitting device is capable of casting light,
the emission controller controlling whether each of the plurality of laser beam sources emits light or not in accordance with a result of detection by the computing unit.

10. The light-emitting device as set forth in claim 1, further comprising a light projection optical member for casting the light emitted from the fluorescent unit,
the fluorescent unit being smaller in size than the light projection optical member.

11. A vehicle headlamp, comprising a light-emitting device as set forth in claim 1.

12. A light-emitting device, comprising:
a plurality of laser beam sources each for emitting a laser beam;
a fluorescent unit for emitting light in response to the laser beam emitted from at least one of the plurality of laser beam sources;
an emission controller for controlling whether each of the plurality of laser beam sources emits light or not, at least a part of the plurality of laser beam sources being positioned in such a manner that irradiation regions of the fluorescent unit which are respectively irradiated with the laser beams emitted from the plurality of laser beam sources are positioned at least partially differently;
at least one optical element for controlling guide of the laser beams emitted from the plurality of laser beam sources toward the fluorescent unit, the plurality of laser beam sources and said at least one optical element being included in a single housing, a seat which is thermally conductive; and a heat radiator for radiating heat generated in the plurality of laser beam sources, the seat having a first plane to which the plurality of laser beam sources are attached and a second plane to which the heat radiator is attached, the first plane being substantially parallel to the second plane.

13. The light-emitting device as set forth in claim 12, wherein said at least one optical element is attached to the first plane of the seat.

14. A light-emitting device, comprising:

a plurality of laser beam sources each for emitting a laser beam;

a fluorescent unit for emitting light in response to the laser beam emitted from at least one of the plurality of laser beam sources;

an emission controller for controlling whether each of the plurality of laser beam sources emits light or not, at least a part of the plurality of laser beam sources being positioned in such a manner that irradiation regions of the fluorescent unit which are respectively irradiated with the laser beams emitted from the plurality of laser beam sources are positioned at least partially differently; and at least one optical element for controlling guide of the laser beams emitted from the plurality of laser beam sources toward the fluorescent unit, wherein said at least one optical element is at least one light guide including an incident end section for receiving the laser beams emitted from the plurality of laser beam sources and an emission end section for emitting the laser beams to the fluorescent unit, and said at least one light guide includes a plurality of light guides, and the plurality of light guide guides each include a core having a polygonal cross section taken in a direction perpendicular to a direction in which the laser beams are guided.

15. A light-emitting device, comprising:

a plurality of laser beam sources each for emitting a laser beam;

a fluorescent unit for emitting light in response to the laser beam emitted from at least one of the plurality of laser beam sources;

an emission controller for controlling whether each of the plurality of laser beam sources emits light or not, at least a part of the plurality of laser beam sources being positioned in such a manner that irradiation regions of the fluorescent unit which are respectively irradiated with the laser beams emitted from the plurality of laser beam sources are positioned at least partially differently; and a computing unit for detecting an object in a light-castable range which is a range in which the light-emitting device is capable of casting light, the emission controller controlling whether each of the plurality of laser beam sources emits light or not in accordance with a result of detection by the computing unit, wherein the computing unit identifies the kind of the object detected by the computing unit, and the emission controller controls whether each of the plurality of laser beam sources emits light or not in accordance with the kind of the object identified by the computing unit.

* * * * *

UNITED STATES PATENT AND TRADEMARK OFFICE
CERTIFICATE OF CORRECTION

PATENT NO.        : 9,068,714 B2
APPLICATION NO.   : 13/855483
DATED             : June 30, 2015
INVENTOR(S)       : Yoshiyuki Takahira et al.

It is certified that error appears in the above-identified patent and that said Letters Patent is hereby corrected as shown below:

In the Claims:

At column 38, claim 14, line 3, please replace "the plurality of light guide guides each include a core" with --the plurality of light guides each include a core--

Signed and Sealed this
Twenty-second Day of September, 2015

Michelle K. Lee
*Director of the United States Patent and Trademark Office*